(12) United States Patent
Hall

(10) Patent No.: US 9,582,237 B2
(45) Date of Patent: Feb. 28, 2017

(54) MODULAR DISPLAY PANELS WITH DIFFERENT PITCHES

(71) Applicant: Ultravision Technologies, LLC, Dallas, TX (US)

(72) Inventor: William Y. Hall, Dallas, TX (US)

(73) Assignee: Ultravision Technologies, LLC, Dallas, TX (US)

( * ) Notice: Subject to any disclaimer, the term of this patent is extended or adjusted under 35 U.S.C. 154(b) by 71 days.

(21) Appl. No.: 14/550,685

(22) Filed: Nov. 21, 2014

(65) Prior Publication Data

US 2015/0186098 A1 Jul. 2, 2015

Related U.S. Application Data

(60) Provisional application No. 62/065,510, filed on Oct. 17, 2014, provisional application No. 62/025,463, (Continued)

(51) Int. Cl.
*G09G 5/00* (2006.01)
*G06F 3/14* (2006.01)
(Continued)

(52) U.S. Cl.
CPC .......... *G06F 3/1446* (2013.01); *G06F 3/1438* (2013.01); *G06T 1/60* (2013.01); *G09G 5/006* (2013.01); *G09G 5/363* (2013.01); *H01H 11/04* (2013.01); *H05K 13/0023* (2013.01); *G09G 3/2088* (2013.01); *G09G 3/32* (2013.01); *G09G 2300/026* (2013.01); (Continued)

(58) Field of Classification Search
CPC ...... G06F 3/1446; G09G 5/006; G09G 4/006; H05K 13/0023

USPC ..................... 345/156, 76, 211, 647, 13, 82; 704/270.01

See application file for complete search history.

(56) References Cited

U.S. PATENT DOCUMENTS 1,816,254 A 7/1931 Heath
3,150,455 A 9/1964 Indorf
(Continued)

FOREIGN PATENT DOCUMENTS

CN 201226214 4/2009
CN 201449702 U 5/2010
(Continued)

OTHER PUBLICATIONS

UK Intellectual Property Office, Search Report in Application No. GB1518912.9, Mar. 2, 2016, pp. 1-6.
(Continued)

*Primary Examiner* — Andrew Sasinowski
*Assistant Examiner* — Kuo Woo
(74) *Attorney, Agent, or Firm* — Slater Matsil, LLP

(57) ABSTRACT

An embodiment method of manufacturing modular panels includes manufacturing a group of modular display panels, including a first and second modular display panel that have the same size and shape. The first modular display panel includes a first pixel array arranged at a first pitch, and the second modular display panel includes a second pixel array that is arranged at a second pitch that is different than the first pitch. Any two modular display panels in the group are capable of being attached to each other in an integrated display system.

33 Claims, 26 Drawing Sheets

Related U.S. Application Data filed on Jul. 16, 2014, provisional application No. 61/922,631, filed on Dec. 31, 2013.

(51) Int. Cl.

| | | |
|---|---|---|
| *H01H 11/04* | (2006.01) | |
| *H05K 13/00* | (2006.01) | |
| *G09G 5/36* | (2006.01) | |
| *G06T 1/60* | (2006.01) | |
| *G09G 3/20* | (2006.01) | |
| *G09G 3/32* | (2016.01) | |

(52) U.S. Cl.
CPC . *G09G 2310/0286* (2013.01); *G09G 2340/14* (2013.01); *G09G 2360/04* (2013.01); *G09G 2360/06* (2013.01); *G09G 2380/06* (2013.01); *Y10T 29/49002* (2015.01); *Y10T 29/49007* (2015.01); *Y10T 29/49105* (2015.01)

(56) References Cited

U.S. PATENT DOCUMENTS

| | | |
|---|---|---|
| 4,457,090 A | 7/1984 | McDonough |
| 4,497,125 A | 2/1985 | Hutchinson |
| 4,782,336 A | 11/1988 | Bailey |
| 4,964,231 A | 10/1990 | De Maat et al. |
| 5,172,504 A | 12/1992 | De Maat et al. |
| 5,341,088 A | 8/1994 | Davis |
| 5,523,769 A | 6/1996 | Lauer et al. |
| 5,600,910 A | 2/1997 | Blackburn |
| 5,722,767 A | 3/1998 | Lin |
| 5,796,376 A | 8/1998 | Banks |
| 5,900,850 A | 5/1999 | Bailey et al. |
| 5,949,581 A | 9/1999 | Kurtenbach et al. |
| 5,990,802 A | 11/1999 | Maskeny |
| 6,045,240 A | 4/2000 | Hochstein |
| 6,065,854 A | 5/2000 | West et al. |
| 6,114,632 A | 9/2000 | Planas, Sr. et al. |
| 6,175,342 B1 | 1/2001 | Nicholson et al. |
| 6,237,290 B1 | 5/2001 | Tokimoto et al. |
| 6,314,669 B1 | 11/2001 | Tucker |
| 6,335,829 B1 | 1/2002 | Van De Voorde |
| 6,362,801 B1 | 3/2002 | Yuhara |
| 6,414,650 B1 | 7/2002 | Nicholson et al. |
| 6,550,521 B1 | 4/2003 | McNabb |
| 6,570,548 B2 | 5/2003 | Smith |
| 6,634,124 B1 | 10/2003 | Bierschbach |
| 6,657,605 B2 | 12/2003 | Boldt, Jr. et al. |
| 6,677,918 B2 | 1/2004 | Yuhara et al. |
| 6,737,983 B1 | 5/2004 | Temple |
| 6,741,222 B1 | 5/2004 | Tucker |
| 6,810,612 B2 | 11/2004 | Huang |
| 6,813,853 B1 | 11/2004 | Tucker |
| 6,819,303 B1 | 11/2004 | Berger et al. |
| 6,998,538 B1 | 2/2006 | Fetterolf, Sr. et al. |
| 7,055,271 B2 | 6/2006 | Lutz et al. |
| 7,072,407 B2 | 7/2006 | Schurig |
| 7,086,188 B2 | 8/2006 | Tsao |
| 7,091,933 B2 | 8/2006 | McClintock et al. |
| 7,161,558 B1 | 1/2007 | Eidem et al. |
| 7,170,480 B2 | 1/2007 | Boldt, Jr. et al. |
| 7,204,602 B2 | 4/2007 | Archer |
| 7,267,459 B2 | 9/2007 | Matheson |
| 7,319,408 B2 | 1/2008 | Temple |
| 7,334,361 B2 | 2/2008 | Schrimpf et al. |
| 7,355,562 B2 | 4/2008 | Schubert et al. |
| 7,450,085 B2 | 11/2008 | Thielemans et al. |
| 7,495,576 B2 | 2/2009 | Maskeny et al. |
| 7,502,950 B1 | 3/2009 | Brands |
| 7,557,781 B2 | 7/2009 | Chuang et al. |
| 7,605,772 B2 | 10/2009 | Syrstad |
| 7,674,000 B2 | 3/2010 | Valerio, Jr. et al. |
| 7,688,280 B2 | 3/2010 | Callegari et al. |
| 7,694,444 B2 | 4/2010 | Miller et al. |
| 7,703,941 B2 | 4/2010 | Lee |
| 7,774,968 B2 | 8/2010 | Nearman et al. |
| 7,779,568 B2 | 8/2010 | Gettelfinger et al. |
| 7,797,865 B2 | 9/2010 | Patel et al. |
| 7,868,903 B2 | 1/2011 | Wendler et al. |
| 7,869,198 B1 | 1/2011 | Nearman et al. |
| 7,907,133 B2 | 3/2011 | Joffer et al. |
| 7,926,213 B1 | 4/2011 | Kludt et al. |
| 7,950,174 B2 | 5/2011 | Xu |
| 7,971,378 B2 | 7/2011 | Campoy Odena |
| 8,007,121 B2 | 8/2011 | Elliott et al. |
| 8,016,452 B2 | 9/2011 | Dunn |
| 8,066,403 B2 | 11/2011 | Sanfilippo et al. |
| 8,074,387 B2 | 12/2011 | Mancuso |
| 8,081,145 B2 | 12/2011 | Ronkholz et al. |
| 8,104,204 B1 | 1/2012 | Syrstad |
| 8,111,208 B2 | 2/2012 | Brown |
| 8,115,229 B2 | 2/2012 | Christy |
| 8,122,627 B2 | 2/2012 | Miller |
| 8,130,175 B1 | 3/2012 | Joffer et al. |
| 8,136,279 B1 | 3/2012 | Nearman et al. |
| 8,154,864 B1 | 4/2012 | Nearman et al. |
| 8,156,672 B2 | 4/2012 | Xu |
| 8,168,990 B2 | 5/2012 | Christy |
| 8,172,097 B2 | 5/2012 | Nearman et al. |
| 8,184,114 B2 | 5/2012 | Oh et al. |
| 8,228,261 B2 | 7/2012 | Callegari et al. |
| 8,281,344 B1 | 10/2012 | Mathias |
| 8,301,939 B2 | 10/2012 | Gloege et al. |
| 8,314,433 B2 | 11/2012 | Christy |
| 8,344,410 B2 | 1/2013 | Wendler et al. |
| 8,350,788 B1 | 1/2013 | Nearman et al. |
| 8,362,696 B2 | 1/2013 | Zheng |
| 8,410,993 B2 | 4/2013 | Jenks et al. |
| 8,414,149 B2 | 4/2013 | Nearman |
| 8,434,898 B2 | 5/2013 | Sanfilippo et al. |
| 8,552,928 B2 | 10/2013 | Wendler et al. |
| 8,558,755 B2 | 10/2013 | Kharrati et al. |
| 8,599,108 B2 | 12/2013 | Kline et al. |
| 8,604,509 B2 | 12/2013 | Wendler et al. |
| 8,648,774 B2 | 2/2014 | Kline et al. |
| 8,702,048 B2 | 4/2014 | Kludt et al. |
| 8,714,665 B2 | 5/2014 | Campagna et al. |
| 8,766,880 B2 | 7/2014 | Kharrati et al. |
| 8,803,766 B2 | 8/2014 | Kline et al. |
| 8,824,124 B1 | 9/2014 | Carlson et al. |
| 8,824,125 B1 | 9/2014 | Cox et al. |
| 9,047,039 B2 | 6/2015 | Perkins et al. |
| 9,047,791 B2 | 6/2015 | Cox et al. |
| 9,167,191 B2 | 10/2015 | Kondo et al. |
| 2001/0037591 A1 | 11/2001 | Nicholson et al. |
| 2002/0126086 A1* | 9/2002 | Takeuchi ............... G09F 9/305 345/156 |
| 2002/0176267 A1 | 11/2002 | Tanaka et al. |
| 2003/0146882 A1 | 8/2003 | Ogino et al. |
| 2003/0158886 A1 | 8/2003 | Walls et al. |
| 2004/0008155 A1 | 1/2004 | Cok |
| 2004/0090391 A1 | 5/2004 | Kondo |
| 2004/0104871 A1* | 6/2004 | Boldt, Jr. .......... G02F 1/133504 345/82 |
| 2004/0186723 A1* | 9/2004 | Mizutani ................ G06F 3/14 704/270.1 |
| 2004/0196049 A1 | 10/2004 | Yano et al. |
| 2004/0222941 A1 | 11/2004 | Wong et al. |
| 2004/0240230 A1 | 12/2004 | Kitajima et al. |
| 2005/0052374 A1 | 3/2005 | Devos et al. |
| 2005/0052375 A1 | 3/2005 | Devos et al. |
| 2005/0078104 A1 | 4/2005 | Matthies et al. |
| 2005/0134525 A1 | 6/2005 | Tanghe et al. |
| 2005/0134526 A1 | 6/2005 | Willem et al. |
| 2005/0178034 A1 | 8/2005 | Schubert et al. |
| 2005/0189311 A1 | 9/2005 | Colby et al. |
| 2005/0190520 A1 | 9/2005 | Schomaker et al. |
| 2005/0264471 A1 | 12/2005 | Yamazaki et al. |
| 2006/0031720 A1 | 2/2006 | Choi |
| 2006/0039142 A1 | 2/2006 | Temple |
| 2006/0132048 A1 | 6/2006 | Popovich |
| 2006/0164587 A1 | 7/2006 | Oh |
| 2006/0170614 A1 | 8/2006 | Tzong et al. |
| 2006/0185612 A1 | 8/2006 | Bonner et al. |

(56) References Cited

U.S. PATENT DOCUMENTS

| | | |
|---|---|---|
| 2006/0241878 A1 | 10/2006 | Jung et al. |
| 2006/0242871 A1 | 11/2006 | Kondo et al. |
| 2006/0256033 A1 | 11/2006 | Chan et al. |
| 2007/0000849 A1 | 1/2007 | Lutz et al. |
| 2007/0279314 A1 | 12/2007 | Brown |
| 2008/0047184 A1 | 2/2008 | Dean |
| 2008/0078733 A1 | 4/2008 | Nearman et al. |
| 2008/0141571 A1 | 6/2008 | Kottwitz |
| 2008/0266206 A1 | 10/2008 | Nelson et al. |
| 2008/0285087 A1 | 11/2008 | Perkins et al. |
| 2008/0303747 A1 | 12/2008 | Velicescu |
| 2009/0021532 A1* | 1/2009 | Gloege ............... H04N 7/0122 345/647 |
| 2009/0024929 A1 | 1/2009 | Gloege et al. |
| 2009/0073080 A1* | 3/2009 | Meersman .......... G02F 1/13336 345/1.3 |
| 2009/0096711 A1 | 4/2009 | Jang et al. |
| 2009/0146910 A1 | 6/2009 | Gardner |
| 2009/0146919 A1 | 6/2009 | Kline et al. |
| 2009/0147028 A1 | 6/2009 | Sefton et al. |
| 2009/0251391 A1* | 10/2009 | Ng ....................... G09G 3/3216 345/76 |
| 2009/0289160 A1 | 11/2009 | Kludt et al. |
| 2009/0322251 A1 | 12/2009 | Hilgers |
| 2010/0026973 A1 | 2/2010 | Hemphill et al. |
| 2010/0123732 A1 | 5/2010 | Jenks et al. |
| 2010/0251583 A1 | 10/2010 | Brown et al. |
| 2010/0288895 A1 | 11/2010 | Shamie |
| 2010/0295424 A1 | 11/2010 | Alexander |
| 2010/0309185 A1* | 12/2010 | Koester .................... G09G 3/32 345/211 |
| 2011/0025696 A1 | 2/2011 | Wyatt et al. |
| 2011/0096568 A1 | 4/2011 | Schattinger et al. |
| 2011/0134640 A1 | 6/2011 | Bertele |
| 2011/0168653 A1 | 7/2011 | Garrett et al. |
| 2011/0205757 A1 | 8/2011 | Whyte |
| 2011/0267328 A1 | 11/2011 | Venkatasubramanian et al. |
| 2012/0005563 A1 | 1/2012 | Gloege et al. |
| 2012/0019490 A1 | 1/2012 | Huang |
| 2012/0021873 A1 | 1/2012 | Brunner |
| 2012/0062540 A1 | 3/2012 | Quadri et al. |
| 2012/0112235 A1 | 5/2012 | Preuschl et al. |
| 2012/0218753 A1 | 8/2012 | Joffer et al. |
| 2012/0218758 A1 | 8/2012 | Wang et al. |
| 2012/0236509 A1 | 9/2012 | Cope et al. |
| 2012/0248950 A1 | 10/2012 | Niibori |
| 2012/0299480 A1 | 11/2012 | Peting et al. |
| 2013/0002634 A1 | 1/2013 | Wendler et al. |
| 2013/0182440 A1 | 7/2013 | Ferrie et al. |
| 2013/0271973 A1 | 10/2013 | Rycyna, III |
| 2013/0279161 A1 | 10/2013 | Pickard et al. |
| 2013/0321387 A1 | 12/2013 | Ohe |
| 2014/0259645 A1 | 9/2014 | Cox et al. |
| 2014/0267784 A1 | 9/2014 | Rykowski |
| 2014/0267896 A1 | 9/2014 | Cox et al. |
| 2015/0145851 A1 | 5/2015 | Takeda et al. |
| 2015/0205565 A1 | 7/2015 | Koguchi |

FOREIGN PATENT DOCUMENTS

| | | |
|---|---|---|
| CN | 201540699 U | 8/2010 |
| CN | 202383944 U | 8/2012 |
| CN | 103280164 | 9/2013 |
| CN | 203250491 U | 10/2013 |
| CN | 203607050 U | 5/2014 |
| WO | 2005083660 A1 | 9/2005 |
| WO | 2014005600 A2 | 1/2014 |

OTHER PUBLICATIONS

Daktronics, "The Smarter Approach to Digital Outdoor," Daktronics Digital Billboard Products, 2013, 16 pages.
Daktronics, "Daktronics LED Billboard Technology," www.daktronics.com Nov. 14, 2013, 3 pages.
Ekta, "WOWStrip," www.ekta-led.com, Jun. 19, 2014, 5 pages.
WOWstrip Semi-Transparent LED Displays product page, http://www.ekta-led.com/prod/68/17/1901, retrieved Jun. 19, 2014, 3 pages.
"What is IP? Explained: Ingress Protection rating (IP Rating, IP65-IP68) system," Waterproof TVs Direct; Apr. 11, 2012; http://waterproftvs-direct.co.uk/blog/waterproof-tv/what-is-ip-ip-explained-ingress-protection-rating-ip-rating-ip65-ip68-system.
International Search Report and Written Opinion received in International Application No. PCT/US2014/072373 mailed Vlay 27, 2015, 19 pages.

* cited by examiner

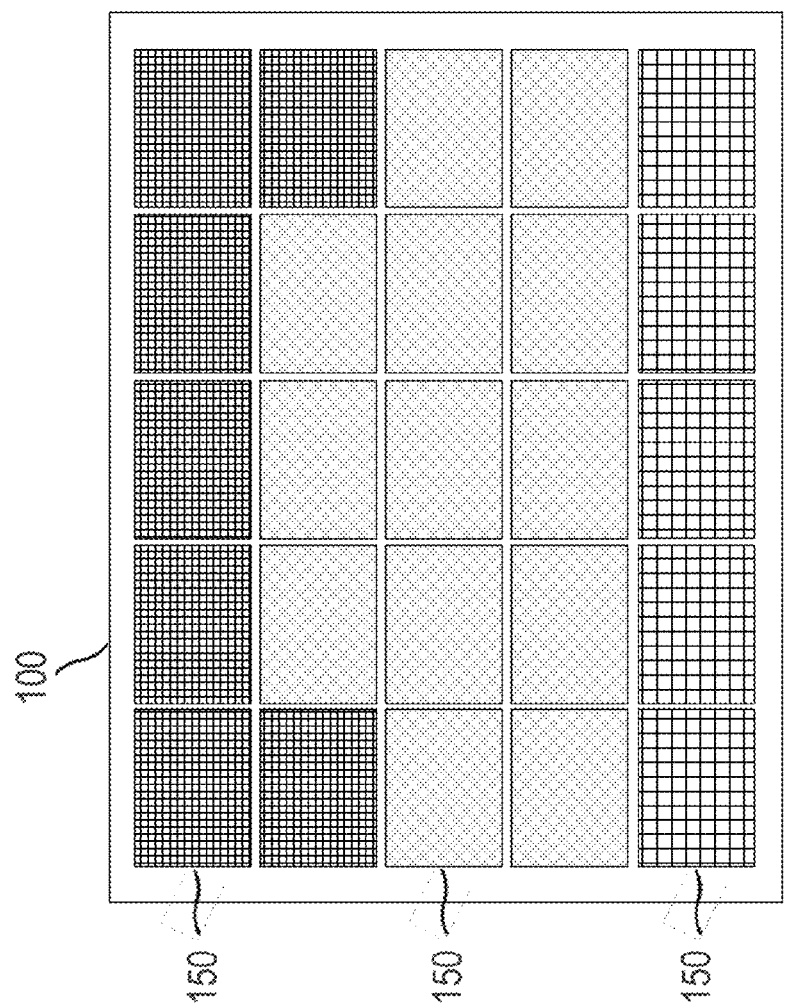

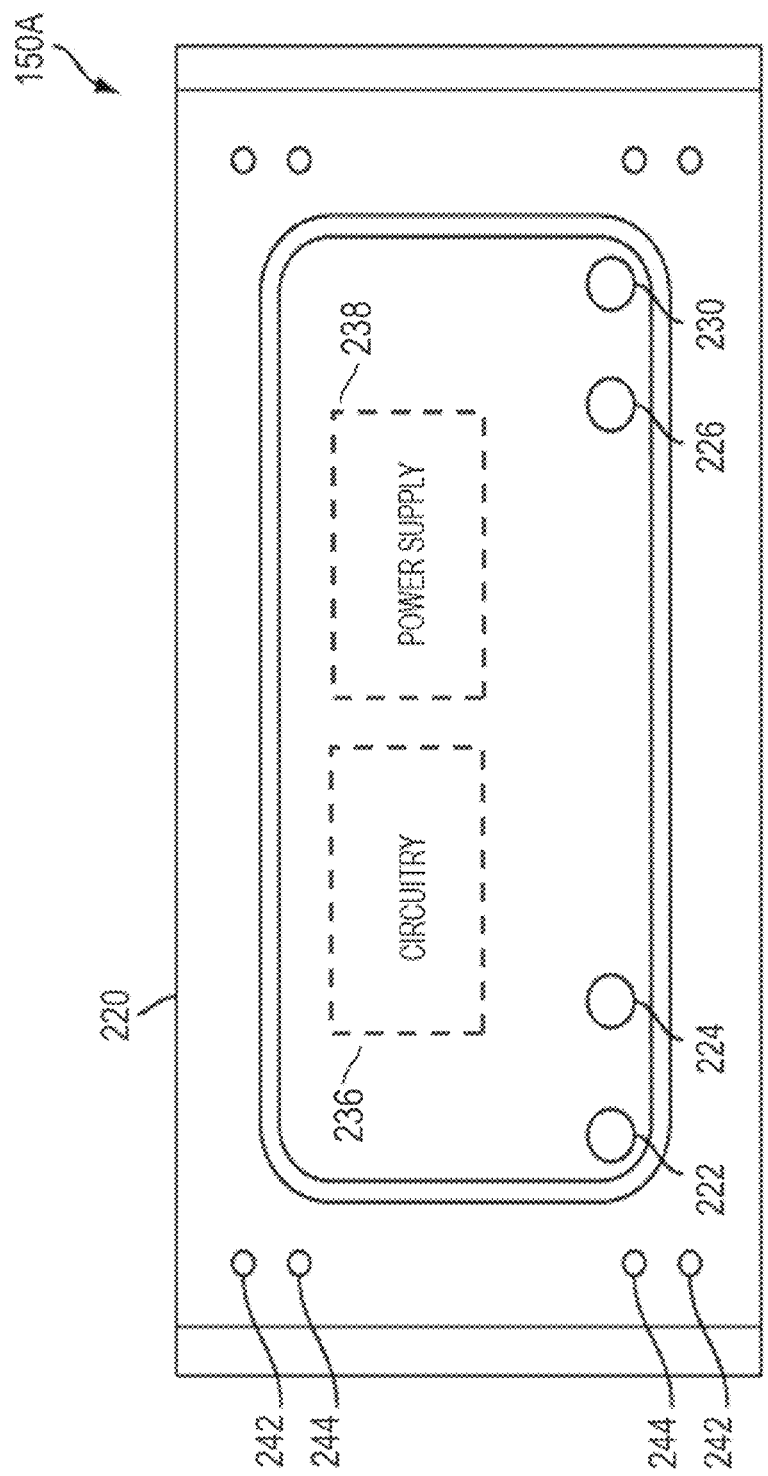

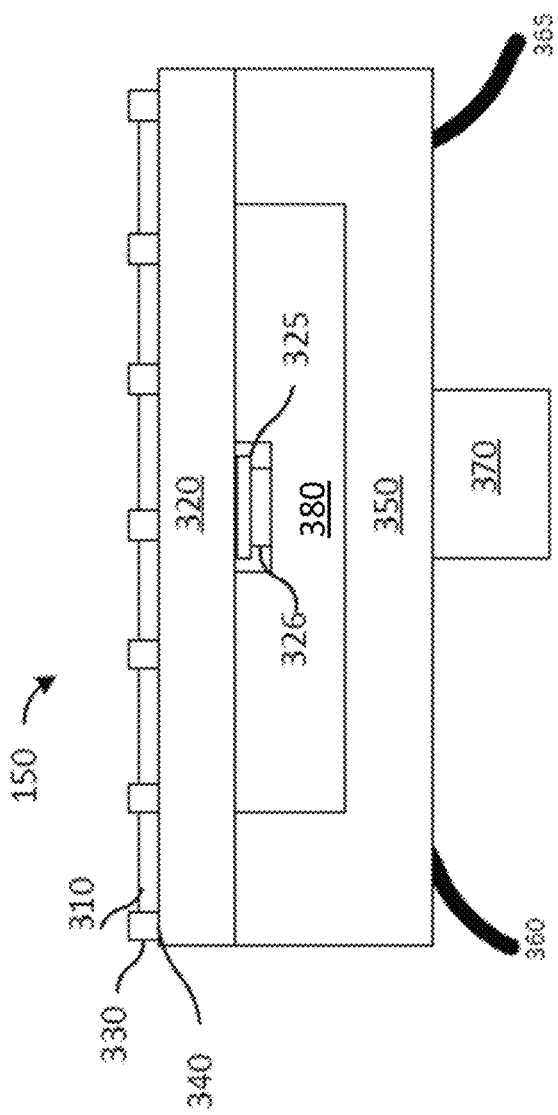

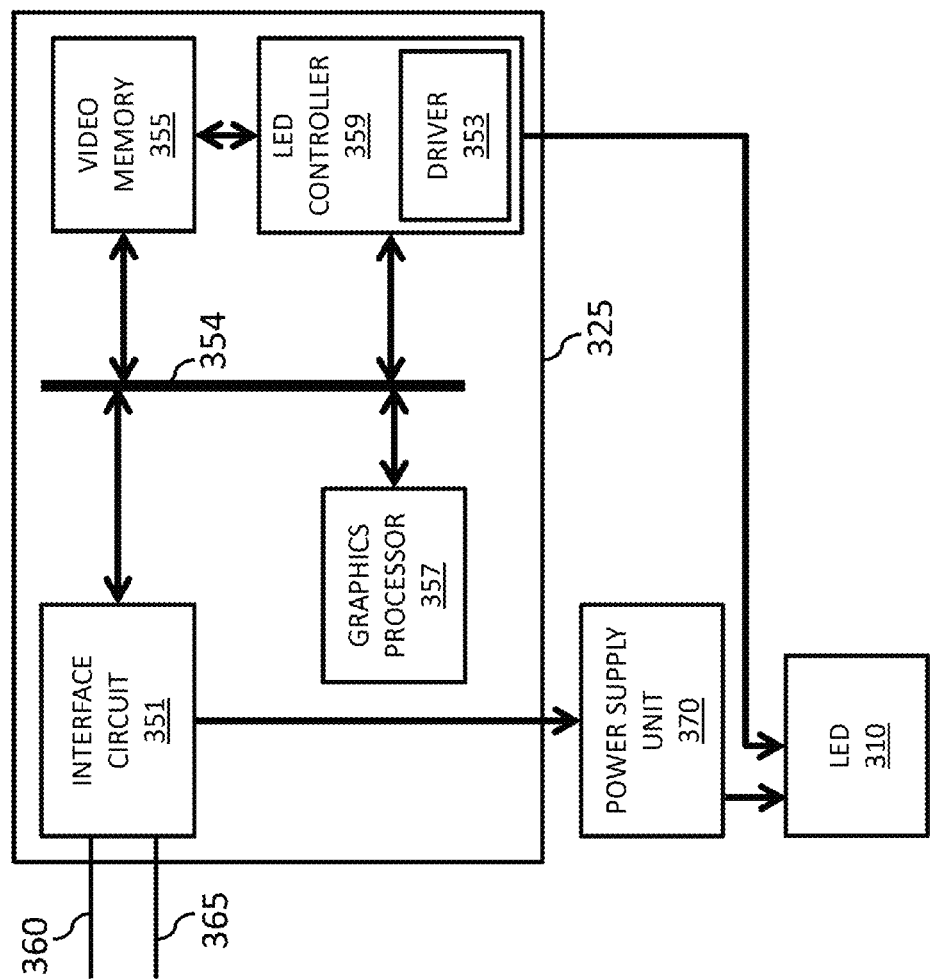

MODULAR DISPLAY PANELS WITH DIFFERENT PITCHES

This application claims the benefit of U.S. Provisional Application No. 62/065,510, filed on Oct. 17, 2014, U.S. Provisional Application No. 62/025,463, filed on Jul. 16, 2014, and U.S. Provisional Application No. 61/922,631, filed on Dec. 31, 2013, which applications are hereby incorporated herein by reference.

TECHNICAL FIELD

The present invention relates generally to displays, and, in particular embodiments, to a system and method for a modular display panels with different pitches.

BACKGROUND

Large displays (e.g., billboards), such as those commonly used for advertising in cities and along roads, generally have one or more pictures and/or text that are to be displayed under various light and weather conditions. As technology has advanced and introduced new lighting devices such as the light emitting diode (LED), such advances have been applied to large displays.

An LED display is a flat panel display, which uses an array of light-emitting diodes. A large display may be made of a single LED display or a panel of smaller LED panels. LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

Many LED display manufacturers sell displays with different resolutions. A present disadvantage of these LED displays is that each one must be a different size to accommodate the pitch needed to obtain the desired resolution. In turn, the existing cabinets and mounting structures must be built to be suitable with the size of the displays.

SUMMARY

Example embodiments of the present disclosure provide a system and method for modular display panels with different pitches.

In accordance with an example embodiment of the present invention, a method of manufacturing modular panels is provided. The method includes manufacturing a group of modular display panels, including a first and second modular display panel that have the same size and shape. The first modular display panel includes a first pixel array arranged at a first pitch, and the second modular display panel includes a second pixel array that is arranged at a second pitch that is different than the first pitch. Any two modular display panels in the group are capable of being attached to each other in an integrated display system.

In accordance with another example embodiment of the present invention, a product portfolio is provided. The product portfolio includes a group of modular display panels, including a first and second modular display panel that have the same size and shape. The first modular display panel includes a first pixel array arranged at a first pitch, and the second modular display panel includes a second pixel array that is arranged at a second pitch that is different than the first pitch. Any two modular display panels in the group are capable of being attached to each other in an integrated display system.

In accordance with another example embodiment of the present invention, a modular display system is provided. The display system includes a mechanical support structure and a group of display panels mounted to the mechanical support structure to form an integrated display panel. The mechanical structure is configured to provide mechanical support to the group of display panels, which include a first display panel and a second display panel each having the same size and shape. The first display panel includes a power source, a first pixel array having a first display resolution and a first pitch, and a first controller coupled to the power source. The second display panel includes a second pixel array having a second display resolution and a second pitch.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A-1B, illustrates a modular multi-resolution display system in accordance with embodiments of the present invention;

FIG. 2, which includes FIGS. 2A and 2B, illustrates one embodiment of an LED panel that may be used as one of the LED panels in the modular multi-resolution display system;

FIG. 3, which includes FIGS. 3A and 3B, illustrates a cross-sectional view and receiver circuit diagram of an embodiment LED panel;

FIG. 5, which includes

FIG. 6, which includes

FIG. 7, which includes

DETAILED DESCRIPTION OF ILLUSTRATIVE EMBODIMENTS

Figure 1B:
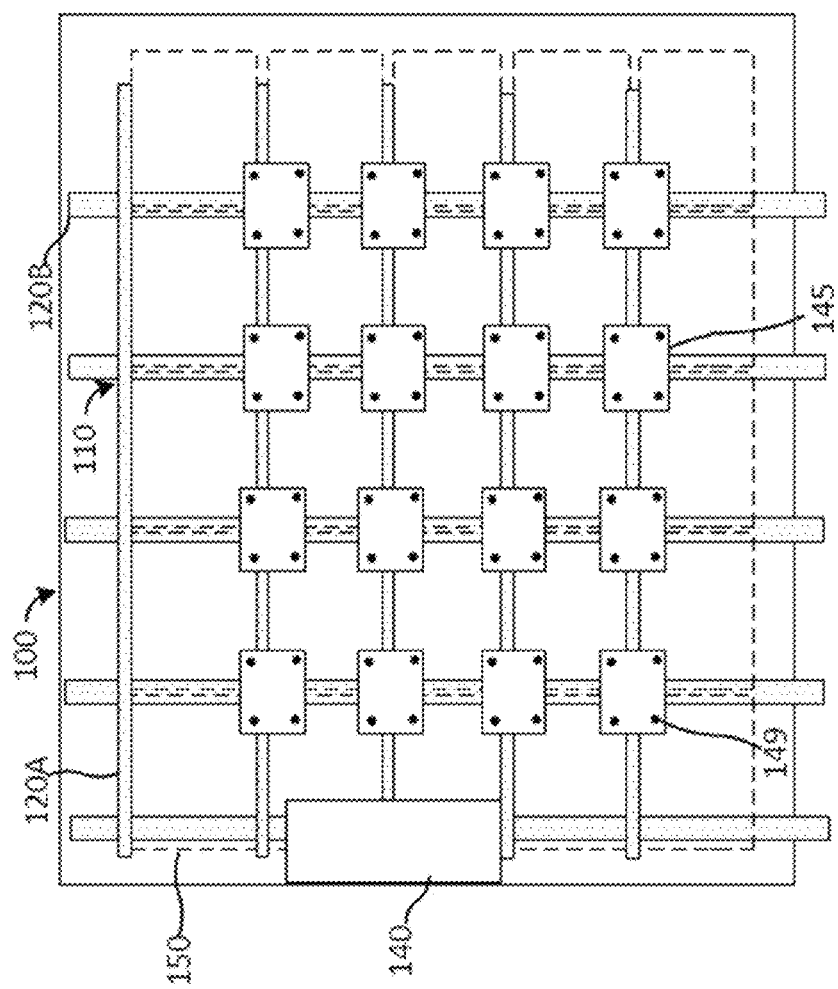

Embodiments of the invention provide display panels, each of which provides a completely self-contained building block that is lightweight. These displays are designed to protect against weather, without a heavy cabinet, although it is understood that the present disclosure may be applied to lighting for any type of interior and/or exterior display. The lightweight design allows for easier installation and maintenance, thus lowering total cost of ownership.

In embodiments of the present invention, a number of different resolution display panels are manufactured and sold but each of these panels is made to have the same physical dimensions. This approach saves cost because standard-size components can be used for the various models of displays that are available. Instead of maintaining inventory of eight different size housings for a product line that includes eight different resolution display panels, a single inventory can be kept, which will lower inventory costs.

Embodiments of the invention provide building block panels that are configurable with future expandability. These displays can offer complete expandability to upgrade in the future without having to replace the entire display. Installation is fast and easy with very little down-time, which allows any electronic message to be presented more quickly.

In some embodiments, the display panels are "hot swappable." By removing one screw in each of the four corners of the panel, servicing the display is fast and easy. Since a highly-trained, highly-paid electrician or technician is not needed to correct a problem, cost benefits can be achieved.

Various embodiments utilize enhanced pixel technology (EPT), which increases image capability. EPT allows image displays in the physical pitch spacing, but also has the ability to display the image in a resolution that is four-times greater.

Embodiments of the present invention will be described in further detail below. A modular multi-panel display system comprising display panels of differing resolutions to a frame will be described using FIG. 1. An embodiment method for initially setting up the modular multi-panel display will be described using FIG. 8. Various embodiments of display panels may be used in the modular multi-panel display, for example, as illustrated below in FIGS. 2 and 3. The panels are then electrically connected to a data source, as described further with respect to FIG. 4. As will be next described using FIG. 5, the transmitted data may be stored in the panels using various signaling formats. The data to be stored is then transmitted to the panels from a data source in accordance with various signaling configurations, as will be described in FIG. 6. Using FIG. 9, an embodiment method for configuring and displaying data on the modular multi-panel display will be described. Various electronic components of individual panels may be interconnected to support the signaling configurations of the modular display as illustrated in FIG. 7.

Referring now to FIG. 1, a modular multi-resolution display system in accordance with embodiments of the present invention is illustrated. FIG. 1A is a front view of a display system that includes display panels of different resolutions. FIG. 1B is a rear view of the display system that illustrates the frame for mounting the display panels.

Referring to FIG. 1A, in this particular example, three different resolution display panels are used, but it is understood that any configuration could be used. For example, Table 1 provides an example of the pitches used for a product line that includes eight different resolution display panels. A single system could include panels with each of the eight pitches shown in Table 1. The software driving the display would provide image data to each panel in a manner appropriate for that panel. Each of the panels in Table 1 is one foot by two feet in dimensions, as an example. The pitch and type of LED used is provided in the table. The pitch is the distance between any two pixels in the panel, and the type of LED may be, for example, a Surface Mount Device (SMD) or a Dual Inline Package (DIP).

TABLE 1

6.35 mm SMD Physical
7.62 mm SMD Physical
9.525 mm SMD Physical
12.7 mm SMD Physical TABLE 1-continued 15.24 mm DIP Physical
19.05 mm DIP Virtual
25.4 mm DIP Virtual
30.48 mm DIP Virtual Referring to FIG. 1A, this particular example shows a display 100 with an arbitrarily chosen 25 LED display panels 150 comprising three different resolution panels. In the present embodiment, the LED display panels 150 use LEDs for illumination, but it is understood that other light sources may be used in other embodiments. One of the advantages of the building block like configuration of the display panels is that any number of panels can be used to create integrated display systems of many sizes and shapes. For example, a display 100 could include 336 panels that are each 1'×2' in dimension to create a 14'×48' display. In such a display, because each panel is lighter than typical panels, the entire display could be built to weigh only 5500 pounds. This compares favorably to commercially available displays of the size, which generally weigh from 10,000 to 12,000 pounds. In another embodiment, a display 100 could include 320 LED display panels 150 arranged in ten rows and thirty-two columns so that the integrated display panel 100 has a display surface that is approximately fifty feet and four inches wide and fifteen feet and eight and three-quarters inches high. In other embodiments, displays with an arbitrary number of panels can be used.

The LED display panels 150 in the embodiment of FIG. 1A typically operate together to form a single image, although multiple images may be simultaneously presented by the display 100. Two or more LED display panels 150 can be coupled for power and/or data purposes, with an LED display panel 150 receiving power and/or data from a central source or another panel and passing through at least some of the power and/or data to one or more other panels. This further improves the modular aspect of the display 100, as a single LED display panel 150 can be easily connected to the display 100 when being installed and easily disconnected when being removed by decoupling the power and data connections from neighboring panels.

The power and data connections for the LED display panels 150 may be configured using one or more layouts, such as a ring, mesh, star, bus, tree, line, or fully-connected layout, or a combination thereof. In some embodiments the LED display panels 150 may be in a single network, while in other embodiments the LED display panels 150 may be divided into multiple networks. Power and data may be distributed using identical or different layouts. For example, power may be distributed in a line layout, while data may use a combination of line and star layouts.

In the embodiment of FIG. 1A, the bottom row has a first resolution such as, for example, a low resolution that is used for captions or other text. The top and corners use a second resolution, for example, a medium resolution to be used for background portions of the image. The center of the display, on the other hand, may have a higher resolution. This region would be capable of showing a more detailed image. Such a configuration is possible because the housings of all of the display panels are the same size and configuration regardless of the resolution. This allows a user to tailor the number of each panel type to gain the best tradeoff between cost and image quality.

Referring to FIGS. 1A and 1B, it is also noted that the uniform size and configuration of the panels enables the panels to be interchanged as needed. More specifically, as panels have an identical footprint in terms of height H, width W, and depth D1, their position on the frame 110 of FIG. 1B does not matter from a size standpoint, but only from a functionality standpoint. Accordingly, the design of the display 100 may then focus on issues such as the required resolution for a particular position and/or other issues such as weight and cost without the need to be concerned with how a particular panel will physically fit into a position on the frame.

Referring to FIG. 1B, the LED display panels 150 are individually attached to a frame 110, which enables each LED display panel to be installed or removed from the frame 110 without affecting the other panels. Each LED display panel 150 is a self-contained unit that couples directly to the frame 110. By "directly," it is understood that another component or components may be positioned between the LED display panel 150 and the frame 110, but the panel is not placed inside a cabinet that is coupled to the frame 110. For example, in this embodiment attachment plates 145 are coupled to the LED display panels 150 and to the frame 110. Other embodiments use an alignment plate, which is a plate that couples to the housing of a panel and to the frame 110 and also interlocks with other alignment plates of adjacent panels, to aid in aligning the panel with adjacent panels. Further the panel may be coupled to the frame 110 without the use of any attachment plates or alignment plates. Whether the panel is coupled to the frame 110, attachment plate 145, and/or the alignment plate, any of these coupling approaches would be "direct" according to the present disclosure.

The attachment plate 145 (or an alignment plate) could be a solid material such as a metal plate or could be a conforming material such as a rubber material embedded with metal particles. In either case, it is desirable that the plate be thermally conductive. One or more attachment features 149 may be used to connect the attachment plate 145 to the LED display panel 150. In the embodiment illustrated in FIGS. 1B and 1C, the attachment plate 145 is a corner plate. Each corner plate is mechanically connected to corners of four of the LED display panels 150 to secure the LED display panels 150 to the horizontal beams 120A and vertical beams 120B of the frame 110.

The frame 110 comprises a plurality of horizontal beams 120A and vertical beams 120B forming the mechanical structure. The frame 110 may be relatively light in weight compared to frames needed to support cabinet mounted LED assemblies. In one embodiment, both horizontal beams 120A and vertical beams 120B may be used to support the LED display panels 150. In another embodiment, horizontal beams 120A but not the vertical beams 120B may be used to support the LED display panels 150. In a third embodiment, vertical beams 120B but not the horizontal beams 120A may be used to support the LED display panels 150.

The frame 110 may include support structures for the electrical cables, data cables, electrical power box powering the LED displays panels 150 and receiver unit 140 controlling power, data, and communication to the LED displays panels. However, the frame 110 does not include any additional enclosures to protect the LED panels, data, power cables from the environment. Rather, the frame 110 is exposed to the elements and further exposes the LED display panels 150 to the environment. The frame 110 also does not include air conditioning, fans, heating units to maintain the temperature of the LED display panels 150. Rather, the LED display panels 150 are hermetically sealed themselves and are designed to be exposed to the outside ambient. Further, in various embodiments, there are not additional cabinets that are attached to the frame 110 or used for housing the LED display panels 150. Accordingly, in various embodiments, the multi-panel modular display, LED display panel 150 is designed to be only passively cooled.

Figure 2A:
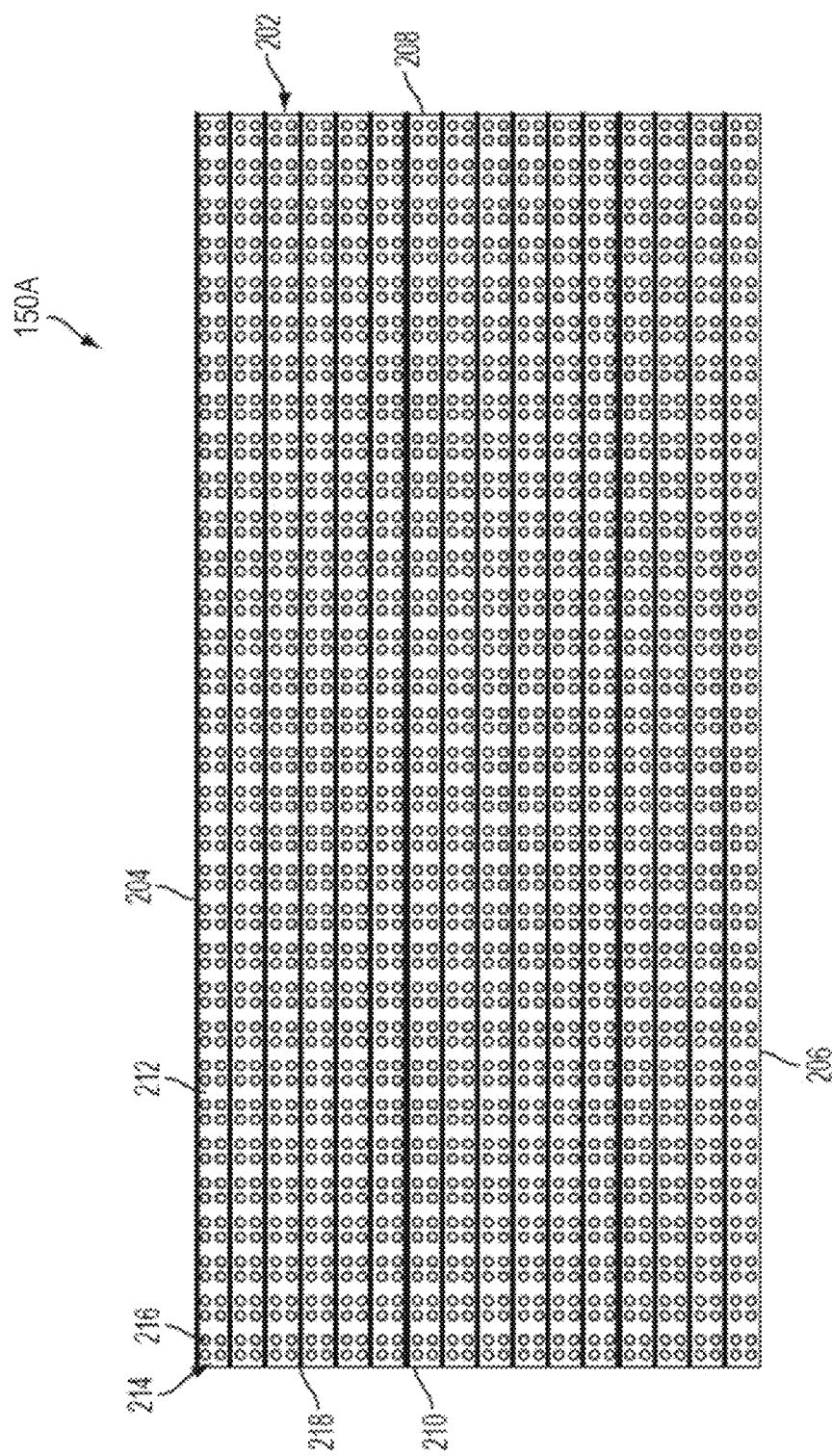

FIGS. 2A-2B illustrate one embodiment of a panel 150A that may be used as one of the LED display panels 150 of FIGS. 1A-1C. FIG. 2A illustrates a front view of the embodiment panel 150A with LEDs aligned in a 16×32 configuration. FIG. 2B illustrates a back view of the panel of this embodiment panel 150A.

Referring to FIG. 2A, an embodiment panel 150A includes a substrate 202 that forms a front surface of the panel 150A. The substrate 202 in the present embodiment is rectangular in shape, with a top edge 204, a bottom edge 206, a right edge 208, and a left edge 210. A substrate surface 212 includes "pixels" 214 that are formed by one or more LEDs 216 on or within the substrate 202. The substrate 202 may form the front surface of the panel 150A, but may not be the outer surface in some embodiments. For example, a transparent or translucent material or coating may overlay the substrate 202 and the LEDs 216, thereby being positioned between the substrate 202/LEDs 216 and the environment. In the present example, each pixel 214 includes four LEDs 216 arranged in a pattern (e.g., a square). For example, the four LEDs 216 that form a pixel 214 may include a red LED, a green LED, a blue LED, and one other LED (e.g., a white LED, a second red LED, etc.). In some embodiments, the other LED may be a sensor. It is understood that more or fewer LEDs 216 may be used to form a single pixel 214, and the use of four LEDs 216 and their relative positioning as a square is for purposes of illustration only. In an embodiment, a single tri-color LED having red, green, and blue inputs forms a single pixel.

Referring to FIG. 2B, the back of panel 150A is illustrated. In the present example, the panel 150A includes coupling points 242 and 244. The panel 150A also has a number of connection points that include a "power in" point 222, a first data point 224, a second data point 226, and a "power out" point 230. One embodiment of the invention provides for an integrated data and power cable, which reduces the number of ports. The power in point 222 enables the panel 150A to receive power from a power source, which may be another panel. In an embodiment, the first data point 224 is a "data in" point that enables the panel to receive data from a data source, which may be another panel, and the second data point 226 is a "data out" point that enables the panel 150A to send data to another panel. In an embodiment where the first data point 224 and second data point 226 are bi-directional, they may each enable the panel 150A to send data to one or more other panels and to receive data from those panels. In other embodiments, the data points can be directional connection points. The power out point 230 enables the panel 150A to send power to another panel.

The connection points may be provided in various ways. For example, in one embodiment, the connection points may be jacks configured to receive corresponding plugs. In another embodiment, a cable may extend from the back panel with a connector (e.g., a jack or plug) affixed to the external end of the cable to provide an interface for another connector. It is understood that the connection points may be positioned and organized in many different ways.

Inside the panel, the power in point 222 and power out point 230 may be coupled to circuitry 236 as well as to the power supply 238. In such embodiments, the circuitry 236 may aid in regulating the reception and transmission of power. In other embodiments, the power in point 222 and power out point 230 may be coupled only to the power supply 238 with a pass through power connection allowing some of the received power to be passed from the power in point 222 to the power out point 230. In some embodiments, the circuitry 236 may identify data used for the panel 150A and also send all data on to other coupled panels via the second data point 226. In such embodiments, the other panels would then identify the information relevant to that particular panel from the data. In other embodiments, the circuitry 236 may remove the data needed for the panel 150A and selectively send data on to other coupled panels via the second data point 226. For example, the circuitry 236 may send only data corresponding to a particular panel to that panel rather than sending all data and letting the panel identify the corresponding data. In some embodiments, the circuitry 236 may include a network receiver card for receiving data over a wide area network, local area network (LAN), or wireless LAN (WLAN).

FIG. 3A illustrates a cross-sectional view of a second embodiment of an LED display panel 150. FIG. 3B illustrates an embodiment receiver circuit 325 of the LED display panel 150.

Referring to FIG. 3A, the casing 350 of the modular display panel 150 has openings through which a first cable 360 and a second cable 365 may be attached. The LED display panels 150 are electrically connected together for data and for power using the first cable 360 and second cable 365. In some embodiments, the first cable 360 is an input cable and the second cable 365 is an output cable. Each modular LED display panel 150 is capable of receiving input using an integrated data and power cable from a preceding modular LED display panel and providing an output using another integrated data and power cable to a succeeding modular LED display panel. Each cable ends with an endpoint device or connector, which is a socket or alternatively a plug.

The modular LED display panel 150 also comprises a plurality of LEDs 310 mounted on one or more printed circuit boards (PCBs) 320, which are housed within a hermetically sealed enclosure or casing. A framework of louvers 330 is attached to the PCB 320 using an adhesive 340, which prevents moisture from reaching the PCB. The LEDs 310 may be directly exposed to the ambient in the direction of light emission or may be covered by a transparent or translucent material or coating. A heat sink 380 is attached between the PCB 320 and the casing 350 and contacts both the PCB 320 and the casing 350 to maximize heat extraction.

A receiver circuit 325 is mounted on the PCB 320. The receiver circuit 325 may be a single chip in one embodiment. Alternatively, multiple components may be mounted on the PCB 320. The receiver circuit 325 may be configured to process the received media and control the operation of the individual LEDs 310. For example, when a single tri-color LED is used to form each pixel, the receiver circuit 325 determines the color and brightness of the LED 310 to be displayed at each pixel by, for example, adjusting the current or pulse width of a plurality of signals applied to the red, green, and blue input pins of the LED 310. When multiple single-color LEDs are used to form each pixel, the receiver circuit 325 determines the brightness of each LED 310 within each pixel by, for example, adjusting the current or pulse width of a single signal applied to the LED 310. A power supply unit 370 may be mounted over the casing 350 for powering the LEDs 310.

Referring to FIG. 3B, a data and power signal received at first cable 360 is processed at an interface circuit 351 of receiver circuit 325. The incoming power is provided to a power supply unit 370.

Another output from the incoming power is provided to second cable 365. This provides redundancy so that even if a component in the LED display panel 150 is not working, the output power is not disturbed. Similarly, second cable 365 includes all the data being received in first cable 360.

In this embodiment, the interface circuit 351 provides the received data to the graphics processor 357 through a data bus 354. In some embodiments, the interface circuit 351 provides only the data segments intended for the LED display panel 150. In other embodiments, the interface circuit 351 provides all incoming data to the graphics processor 357. For example, the graphics processor 357 may perform any necessary decoding or (when signaling between panels is analog) analog-to-digital conversion of the received media. In other embodiments, the interface circuit 351 interfaces directly with the LED controller 359 without use of a graphics processor 357. In the embodiment of FIG. 3B, the graphics processor 357, LED controller 359, or interface circuit 351 may use the buffer video memory 355 as needed to store video segments during processing. In some embodiments, the buffer video memory 355 may be a component of the LED controller 359. The buffer video memory 355 may also be used to digitally store video segments temporarily until the receiver circuit 325 collects enough data for simultaneous display by the LEDs 310. This collection of data may be a video frame for simultaneous display by all of the LEDs of the display panel, or it may be a smaller portion of data for display by a subset of the LEDs in accordance with, for example, a scanning pattern. The buffer video memory 355 may also be used to temporarily store video segments destined for other display panels.

The LED controller 359, which may include an address decoder (e.g., a demultiplexer), receives the media to be displayed and identifies individual LEDs in the LEDs 310 that need to be controlled. The LED controller 359 may determine an individual LED's color, brightness, refresh time, and other parameters associated to generate the display. For example, at each pixel location in the display, the color of the pixel may be selected by powering one or more combination of red, blue, green, and white LEDs. The LED controller 359 may include control circuitry such as a row selector and column selector for determining LED parameters as an example. In one embodiment, the LED controller 359 may provide these LED parameters to the current driver 353, which acts as either a current source or a current sink to select the appropriate current for the particular LED. In some embodiments, the current driver 353 acts as a current source or sink to provide a constant current with a constant pulse width to the LEDs 310. In other embodiments, the current driver 353 varies the duty cycle of a constant current to pulse width modulate the brightness of the LEDs 310. The current driver 353 may either be a component of the LED controller 359 or may be located outside the LED controller 359, such as, for example, being located inside the power supply unit 370.

The power supply unit 370 may include, for example, a power converter for converting ac to dc, which is supplied to the LEDs 310. Alternatively, the power supply unit 370 may include a down converter that down converts the voltage suitable for driving the LEDs 310. In one embodiment, the power supply unit includes a scan controller that interfaces directly with the LEDs 310. For example, the current driver 353 may provide a constant current to the LEDs 310 while a scan controller of the power supply unit 370 controls the select line needed to turn ON or OFF a particular LED. In some embodiments, a scan controller of the power supply unit 370 is implemented as an array of switches or transistors that switches incoming power to a selected row or column of LEDs 310. In other embodiments, the scan controller switches the output of the LED controller 359 to a selected row or column. The scan controller switches the LED controller output or power in accordance with, for example, an LED address, a row address, a column address, a pre-configured scanning pattern for scan groups of linked LEDs that should be activated simultaneously, or a scan select signal that specifies which scan group should be activated.

Figure 4:
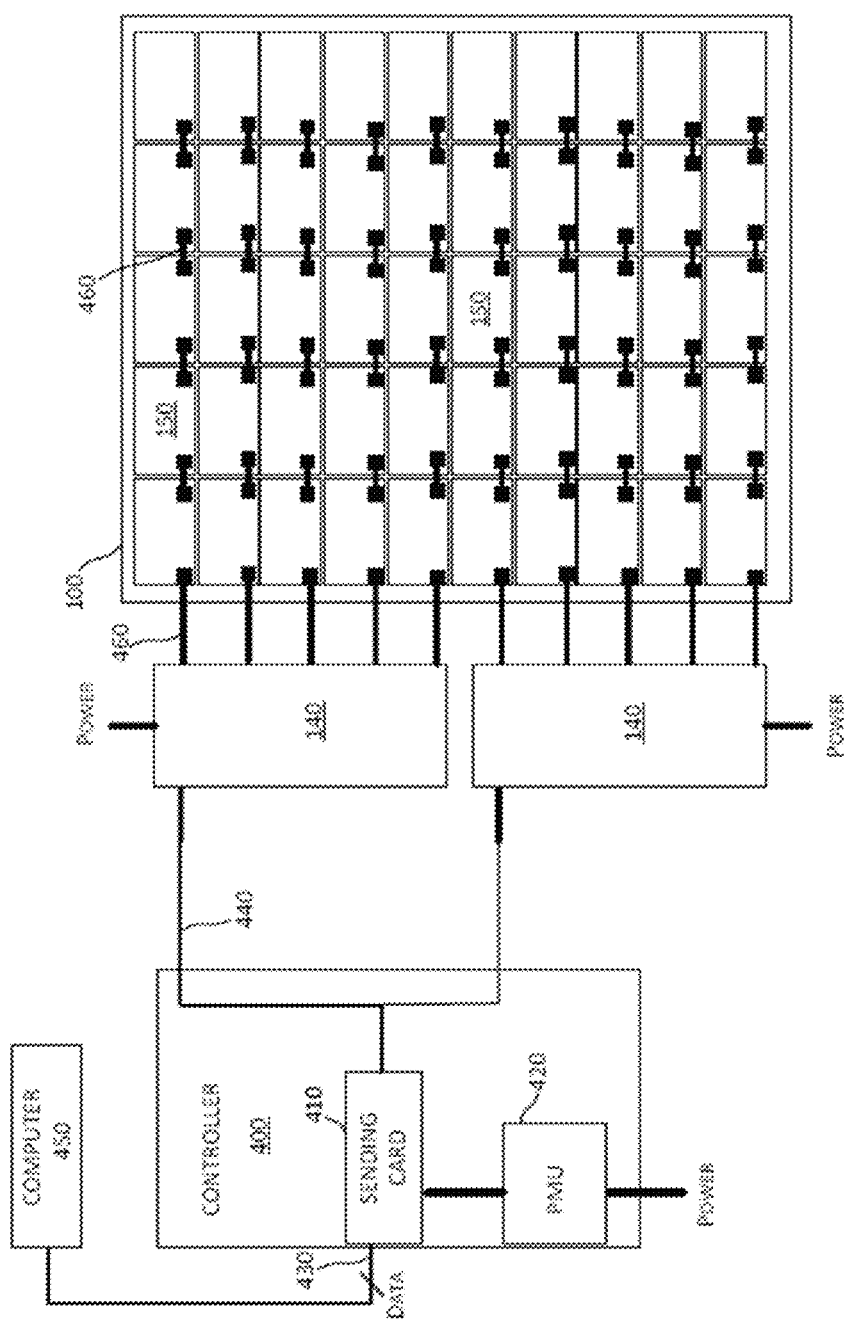
FIG. 4 illustrates an embodiment configuration for connecting LED panels to a video data source.

FIG. 4 illustrates an embodiment configuration for connecting LED display panels 150 to a video data source. Referring to FIG. 4, the LED display panels 150 are arranged in an array of rows and columns. Each LED display panel 150 of each row is electrically connected to an adjacent LED display panel 150 within that row. Each LED display panel is also electrically connected to a data source and to a power source. In various embodiments, a receiver unit 140 is mounted to the mechanical support structure or frame 110. The receiver unit 140 is configured to receive data from a controller 400 and to provide power, data, and communication to the LED display panels 150 through integrated power and data cables 460. The first cable 360 and the second cable 365 in FIG. 3A are specific applications of the integrated power and data cables 460 illustrated in FIG. 4.

The integrated power and data cable 460 includes wires for carrying data/control information and wires for carrying power. The data/control wires may include twisted pair. The length of the data and power wires may be controlled to provide signal propagation within each LED display panel within a specific time. The data/control wires may be configured to transport data at a high bit rate, e.g., at least 1 Mbit/s, and may be 100-1000 Mbit/s. To minimize noise, the cable as a whole may be shielded or the data/control wires or twisted pairs of data/control wires may be shielded separately. In some embodiments, the power connections to the power wires can be configured so that power is run across all of a row (or any other group of panels). In this manner, if the power supply of any one of the panels fails, the other panels will continue to operate. In some embodiments, a first LED display panel in each row may be electrically coupled to the receiver unit 140. The other LED display panels in each row may be daisy-chain coupled to an adjacent LED display panel.

A controller 400 may be connected to the receiver unit through a data network 440 that is a wired or wireless network. Data to be displayed at the multi-panel display system may be first received from a computer 450, which may be a media server, at a controller 400. The controller 400, which may also be part of the media server, may transmit the data to be displayed to one or more receiver units 140. A very large display may include more than one receiver units 140. The receiver units 140 receive the data to be displayed from the controller 400, and distribute it across to the multiple display panels.

The controller 400 may be remotely located or located on-site in various embodiments. The controller 400 is configured to provide data to display to the receiver unit 140. The output of the controller 400 may be coupled through a network cable or WLAN to the receiver unit 140. Alternatively, the output of the controller 400 may be coupled to an ingress router of the internet and the receiver unit 140 may be coupled to an egress router if the controller 400 is located remotely.

The receiver unit 140 connects the LED display panels with data to be displayed on the integrated display and with power to power each of the LED display panels 150. In one or more embodiments, the receiver unit 140 creates multiple outputs, where each output is configured for each panel under its control. Alternatively, the LED display panels 150 may be configured to decode the received data and select and display only the appropriate data intended to be displayed by that particular LED display panel 150. The receiver unit 140 may transmit the media or data to be displayed in a suitable encoded format.

In one or more embodiments, the receiver unit 140 transmits analog video. For example, in one embodiment, composite video may be outputted by the receiver unit 140. In a second embodiment, luminance-blue-difference-red-difference ($YC_BC_R$) analog component video may be outputted by the receiver unit 140. In a third embodiment, luminance-chrominance (YC) encoded analog video may be outputted by the receiver unit 140. In a fourth embodiment, red-green-blue (RGB) analog video may be outputted by the receiver unit 140. In other embodiments, the output video of receiver unit 140 comprises video to be displayed encoded in a digital video format (e.g., 4:4:4 $YC_BC_R$, 4:2:2 $YC_BC_R$, 4:4:4 RGB, 4:2:2 RGB, etc.) by each of the display panels under the receiver unit 140.

Figure 5A:
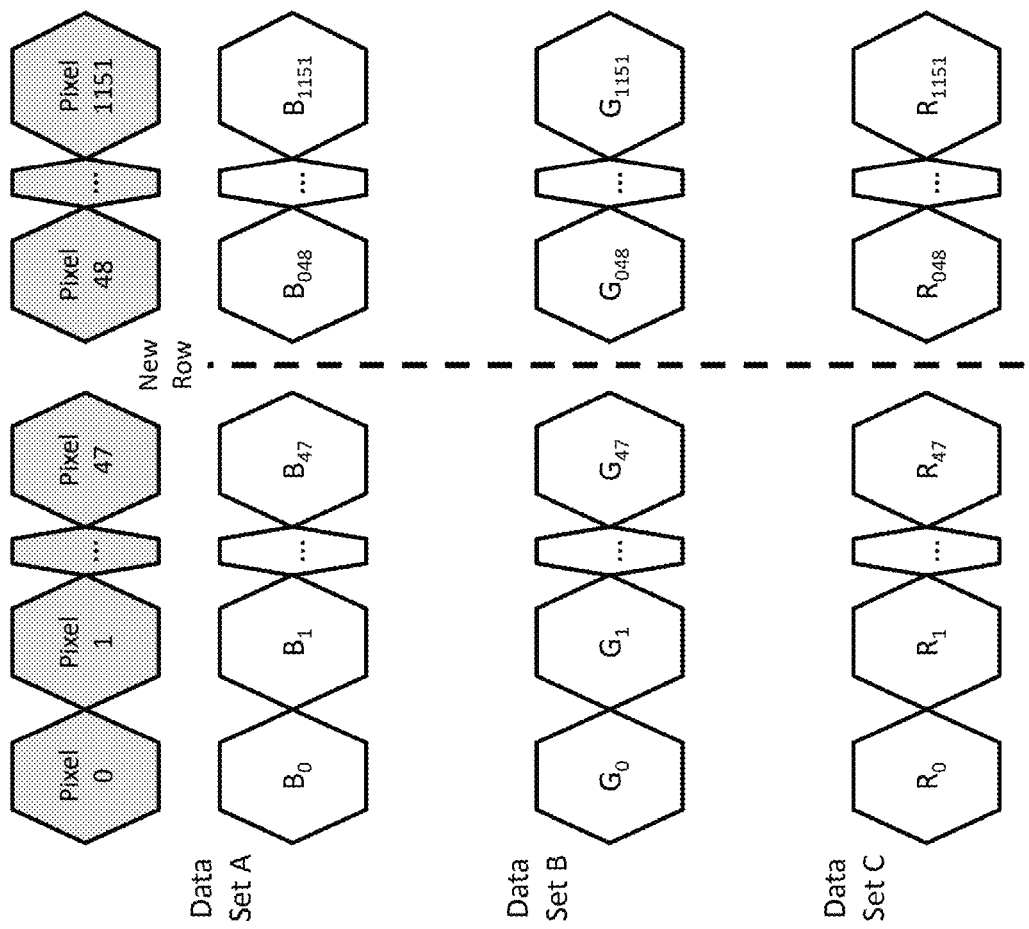
FIGS. 5A-5G, illustrates embodiment formats for digitally storing video data in video memory buffers of LED panels.
Figure 5B:
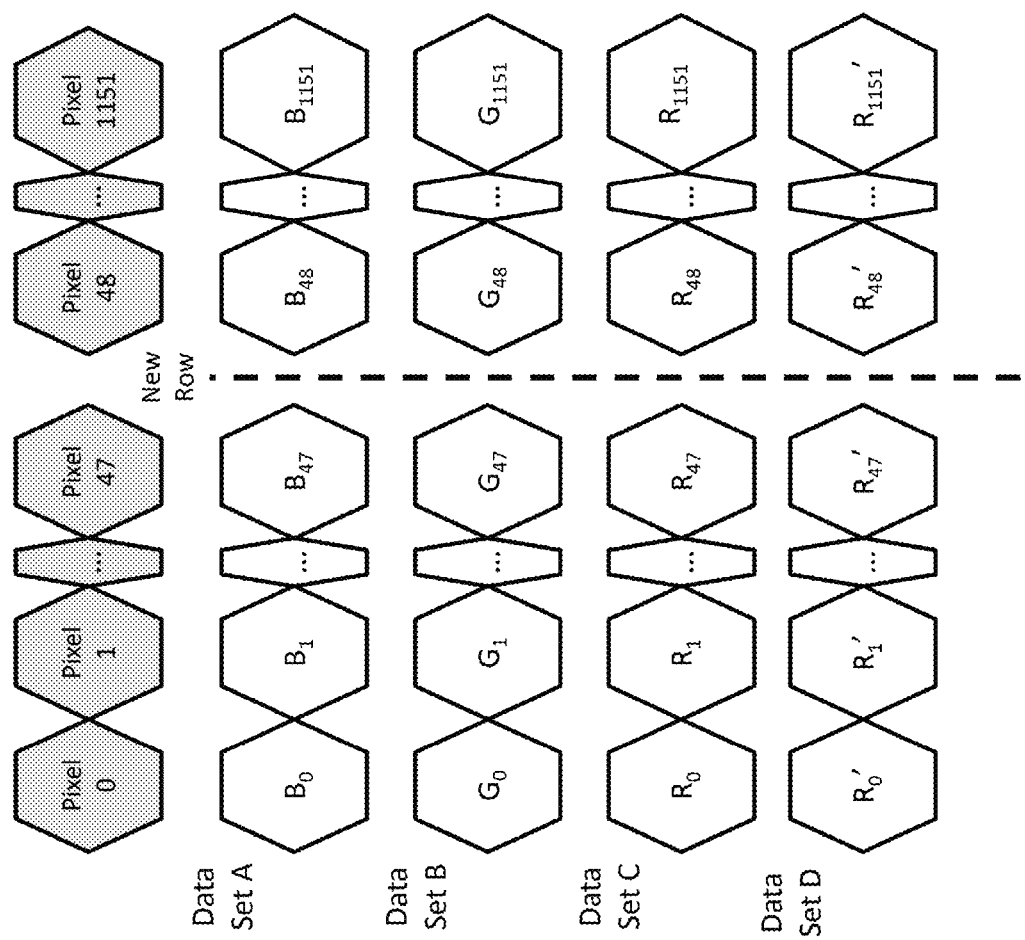
Figure 5C:
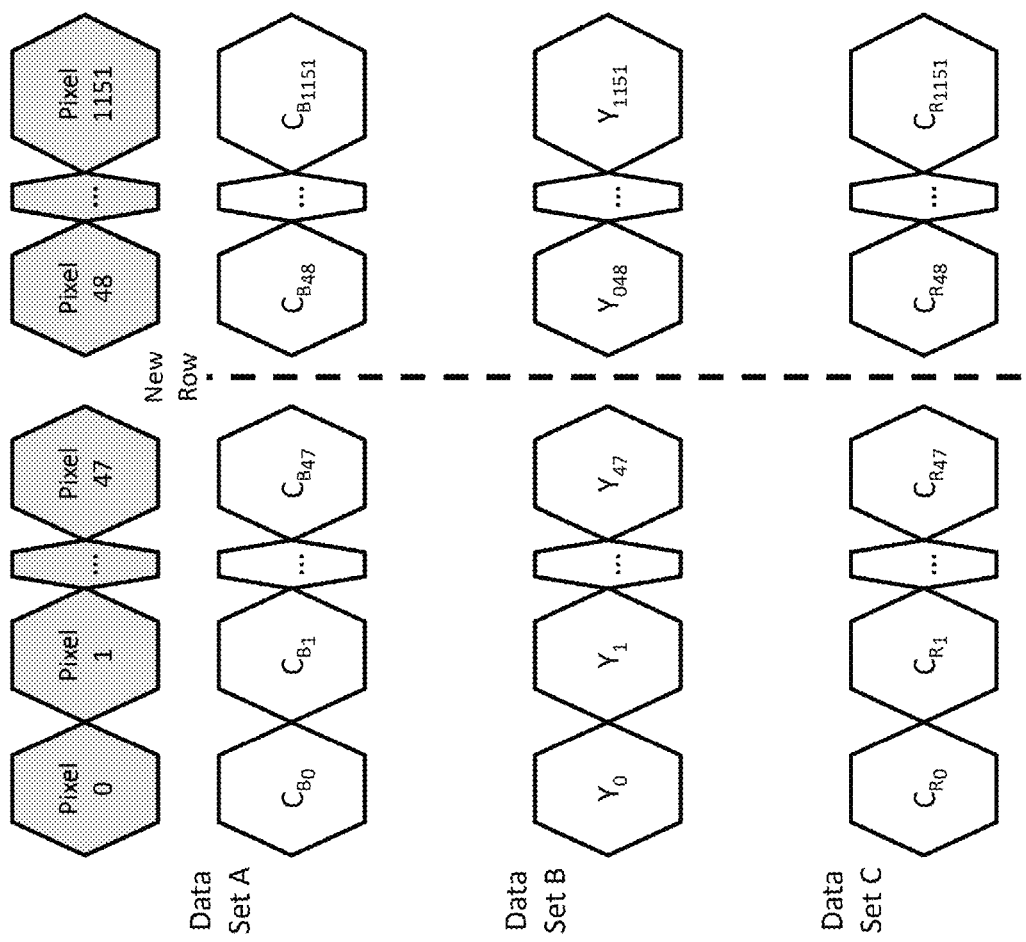
Figure 5D:
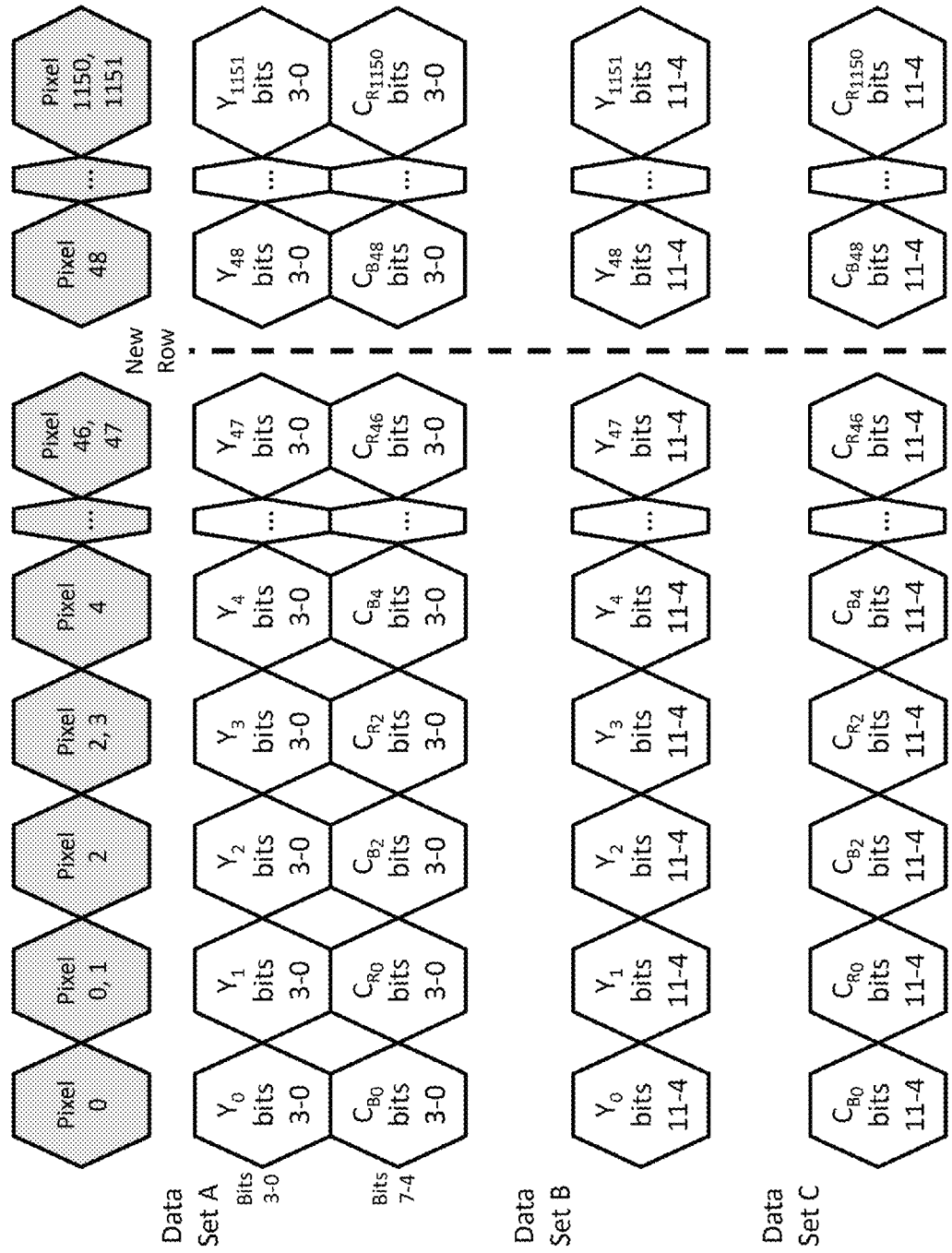
Figure 5E:
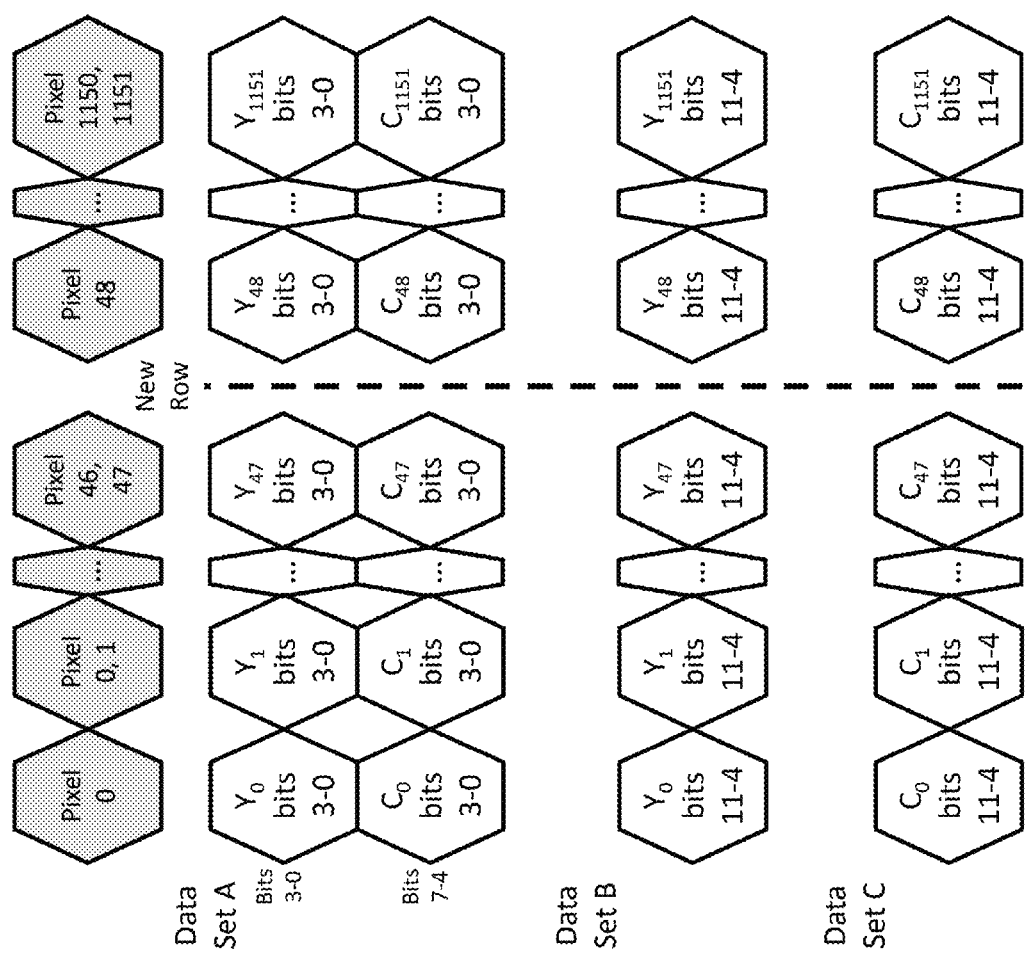
Figure 5F:
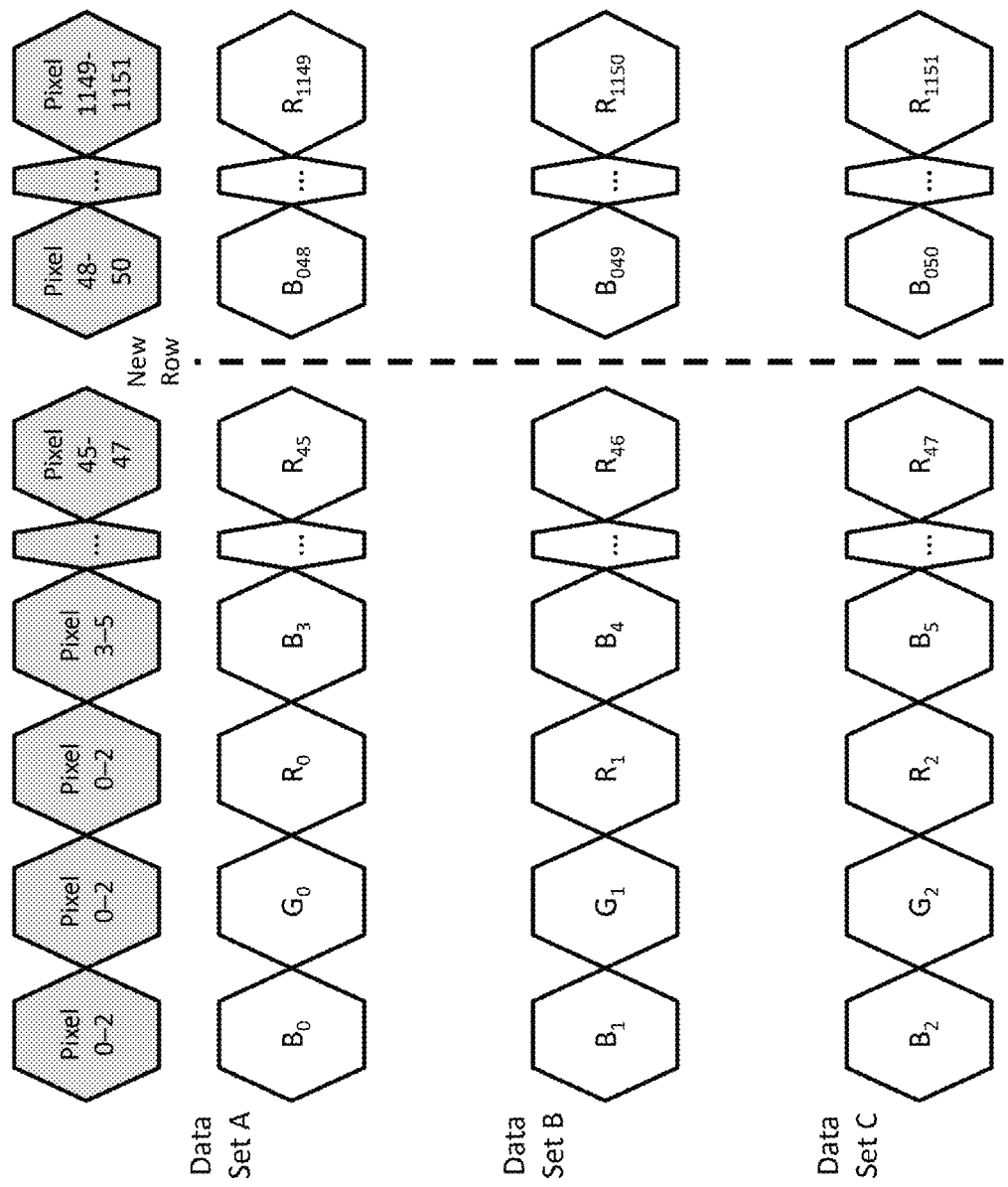

FIG. 5, which includes FIGS. 5A-5G, illustrates embodiment formats for digitally storing video data in video memory buffers of LED panels after the data has been transmitted by the receiver unit. FIG. 5A illustrates digital storage of RGB component data stored in three data sets in accordance with a 4:4:4 sampling ratio after the data has, for example, been transmitted across three channels or has been serially multiplexed on a single transmission channel from the receiver unit. FIG. 5B illustrates digital storage of RGB component data stored in four data sets in accordance with a 4:2:2 sampling ratio. FIG. 5C illustrates digital storage of $YC_BC_R$ component data in three data sets in accordance with a 4:4:4 sampling ratio. FIG. 5D illustrates digital storage of $YC_BC_R$ component data in three data sets in accordance with a 4:2:2 sampling ratio. FIG. 5E illustrates digital storage of YC data in three data sets. FIG. 5F illustrates digital storage of RGB data that is divided into three data sets in accordance with a pixel-by-pixel distribution.

FIG. 5A illustrates an embodiment frame of video data distributed in three data sets in accordance with a 4:4:4 RGB component 24-bit format. In other embodiments, different numbers of data sets and memory locations could be used. This exemplary frame contains 1152 pixels organized into 24 horizontal lines or rows of 48 pixels each, which corresponds to a 1'×2' display panel with a pitch of 12.7 mm between pixels. Other frame sizes would be used for other embodiment panels having differing numbers of pixels. In this embodiment, data set A contains pixel components of 8 bits representing the blue component of each pixel. 8 bits is the word size of this embodiment. In other embodiments, different word sizes may be used. As an example, $B_0$ is 8 bits of data storing the blue pixel value of the first pixel in the first line. A first group of 48 pixel blue components of 8 bits each precede a first new row divider. In an embodiment, this new row divider is a horizontal synchronization (HSYNC) symbol included in the data stream to demarcate the end of a horizontal line of data to be displayed. In other embodiments, the new row divider of FIG. 5A indicates that preceding pixels are stored in a different portion of memory than those pixels that follow the new row divider. This division into different areas of memory may be accomplished by, for example, sizing each memory partition to hold only the data necessary for a single row of pixels. Alternatively, a new row could be indicated by a control signal provided by the receiver unit to the panel to demarcate the end of a horizontal line of data to be displayed. The stored data contains each new row of data in subsequent groups of 48 blue components up to the end of the frame, which contains a total of 1152 8-bit blue components corresponding to the 1152 pixels in the frame. Similarly, data set B is divided into a new row after every 48 8-bit red pixel components in a set of 1152 red components, and data set C is a third digital data set is divided into a new row after every 48 8-bit green pixel components in a set of 1152 green components. In an embodiment, current driver 353 of FIG. 3B may use these RGB components in data sets A, B, and C to drive LEDs in an embodiment display panel having a 12.7 millimeter pitch.

FIG. 5B illustrates an embodiment frame of video data distributed over four digital memory locations of the buffer video memory 355 of FIG. 3B in accordance with a 4:2:2 RGB component 32-bit format. The difference between this embodiment and the embodiment of FIG. 5A is that 16 bits representing the red component of each pixel are included in the stored data, with 8 bits being provided by the R data in data set C and an additional 8 bits provided by the R' data in data set D.

FIG. 5C illustrates an embodiment frame of video data distributed over three digital memory locations of buffer video memory 355 in accordance with a 4:4:4 $YC_BC_R$ component 24-bit format. The difference between this embodiment and the embodiment of FIG. 5A is that data set A contains blue difference data in 8-bit pixel components, data set B contains luminance data in 8-bit pixel components, and data set C contains red difference data in 8-bit pixel components.

FIG. 5D illustrates an embodiment frame of video data distributed over three digital memory locations of buffer video memory 355 in accordance with a 4:2:2 $YC_BC_R$ component 24-bit format. The difference between this embodiment and the embodiment of FIG. 5C is that data set A contains 8-bit pixel components comprised of 4 bits representing the luminance component of each pixel and 4 bits representing either the blue-difference or red-difference component of each alternating pixel.

FIG. 5E illustrates an embodiment frame of equally sampled 24-bit YC video data distributed over three digital memory locations of buffer video memory 355. The difference between this embodiment and the embodiment of FIG. 5D is that blue difference and red difference data are replaced by 12-bit chrominance data, four bits of which are stored in each 8-bit pixel component of data set A, and eight bits of which are stored in each 8-bit pixel component of data set C.

FIG. 5F illustrates an embodiment frame of 4:4:4 24-bit RGB video data distributed over three digital memory locations of buffer video memory 355 in accordance with a pixel-by-pixel distribution. The difference between this embodiment and the embodiment of FIG. 5A is that the number of pixels in a video frame is divided between the three data sets so that, for example, all the component data for a given pixel could be stored in the same form in which it is transmitted over the same serial data channel. In this embodiment, each data set contains all components for a third of the pixels in a video frame, with the pixels assigned to each data set alternating with each pixel.

Figure 5G:
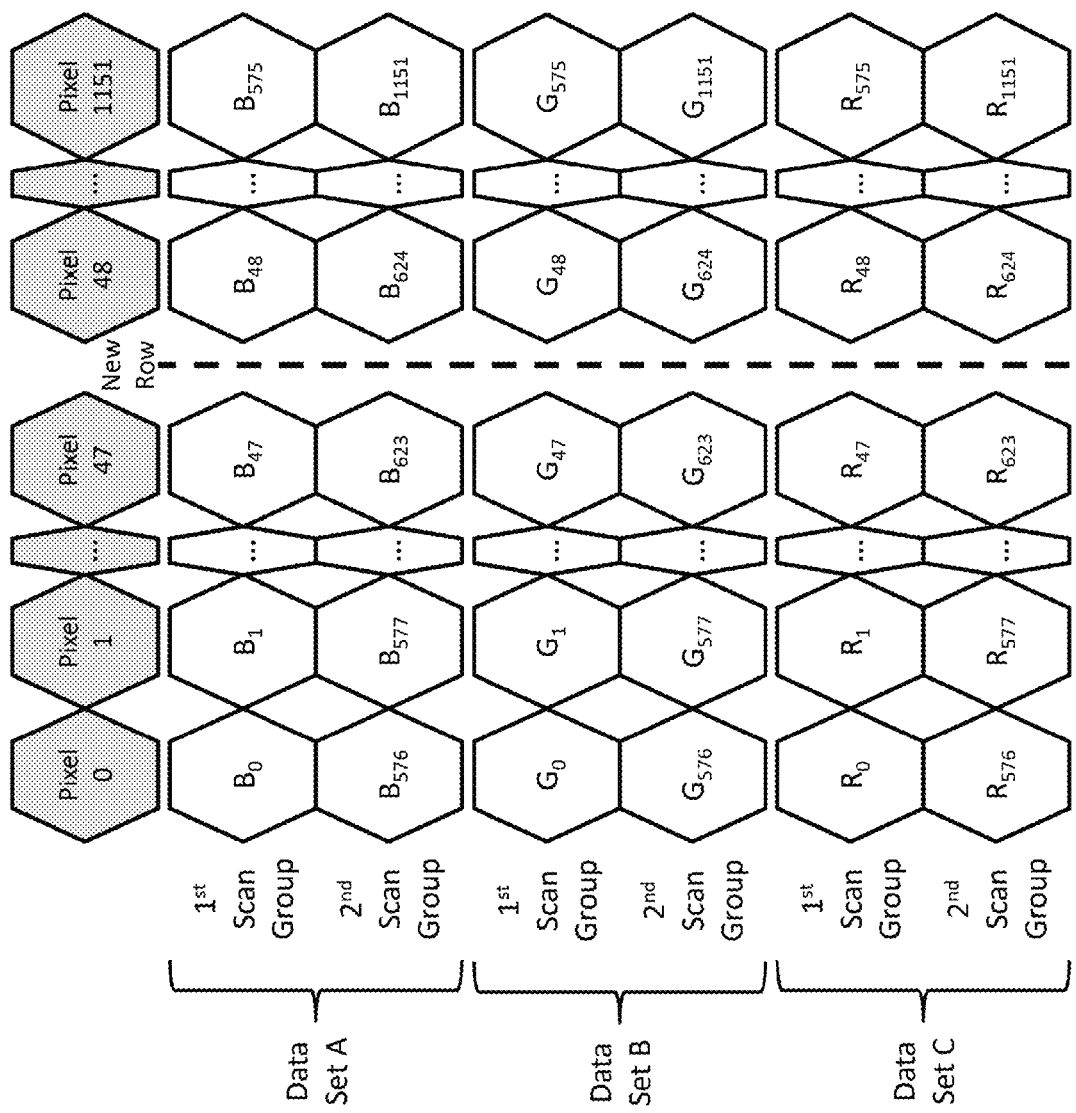

FIG. 5G illustrates an embodiment frame of 4:4:4 24-bit RGB data distributed over three data channels in accordance with a scanning pattern. The difference between this embodiment and the embodiment of FIG. 5A is that each data set is divided among two scan groups. During a first scanning period, the data in the first scan group of data sets A-C is digitally stored. During a second scanning period, the data in the second scan group of data sets A-C is digitally stored, overwriting the data in the first scan group. Storage of data continues in alternating scanning periods as each video frame is received and digitally stored in buffer video memory 355.

Figure 6A:
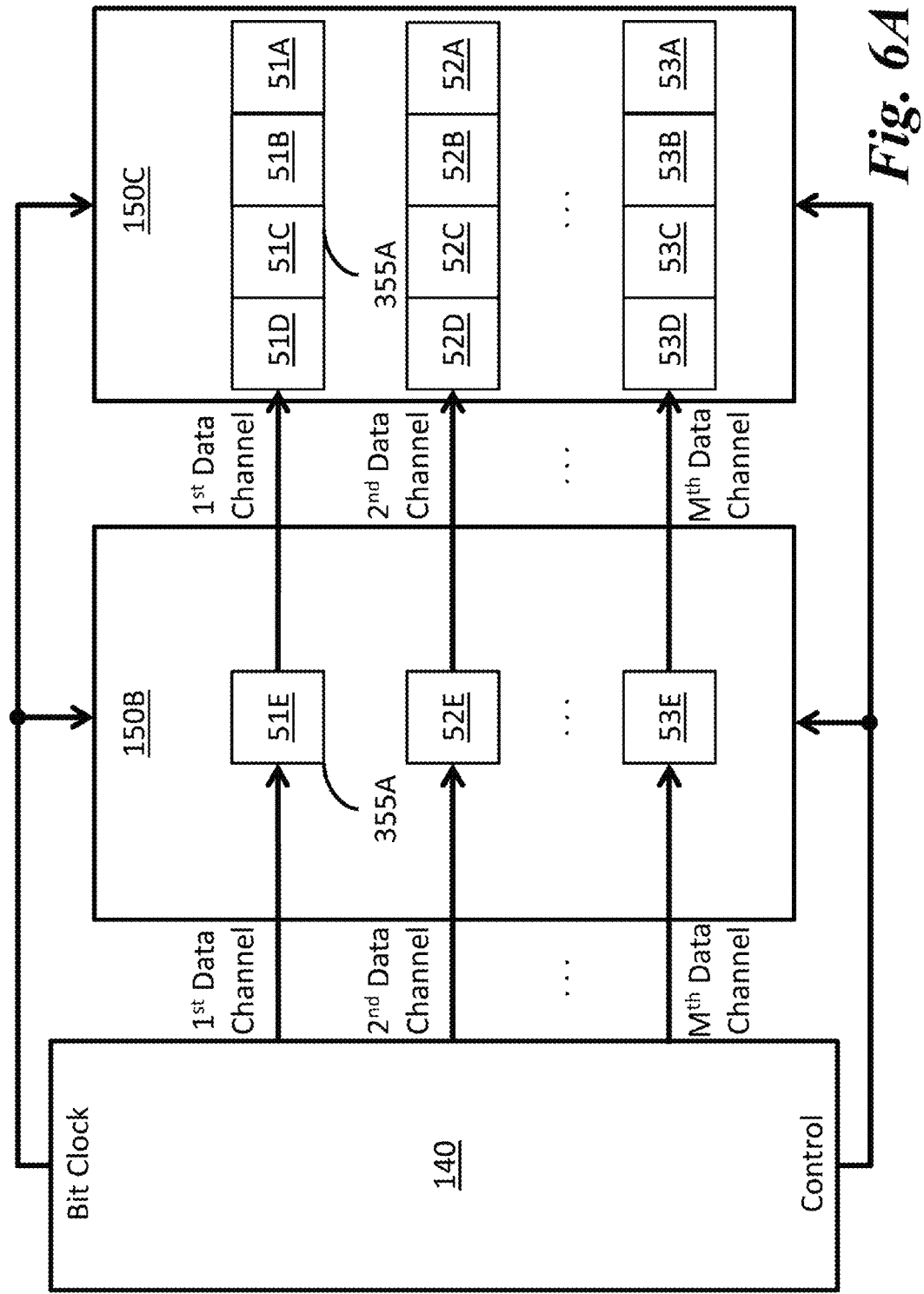
FIGS. 6A-6E, illustrates embodiment signaling configurations for transmitting data from a data source to LED panels.
Figure 6B:
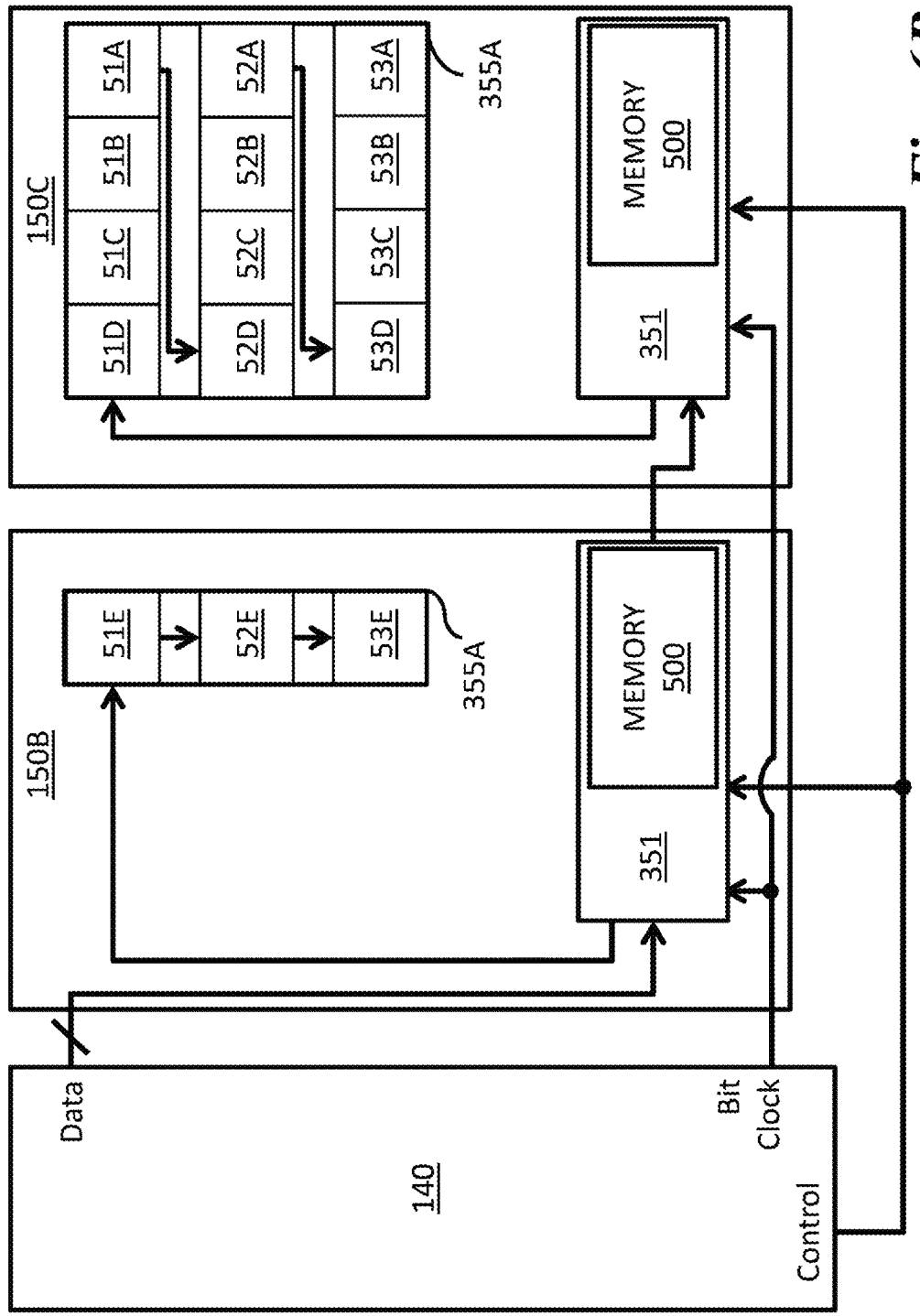
Figure 6C:
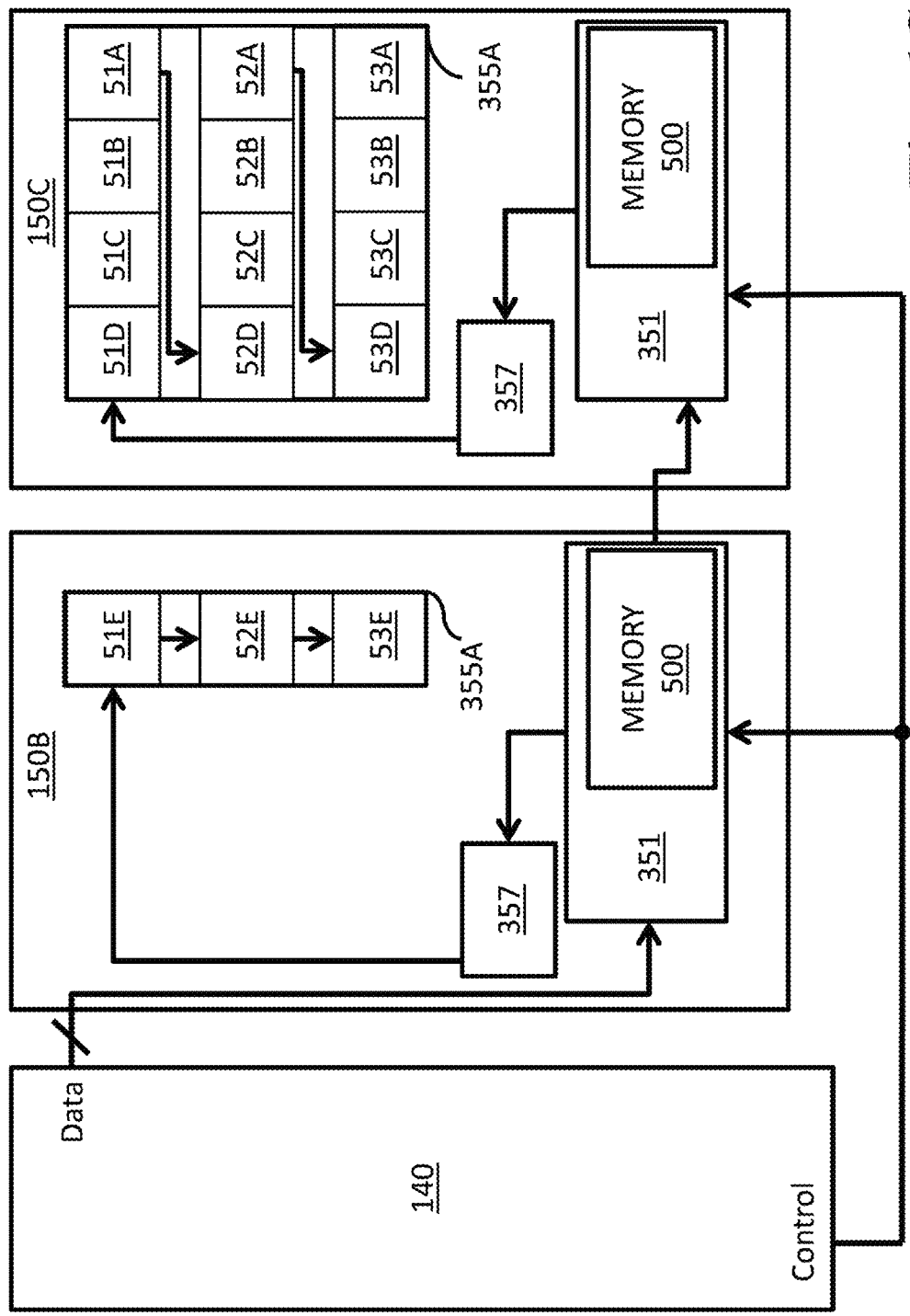
Figure 6D:
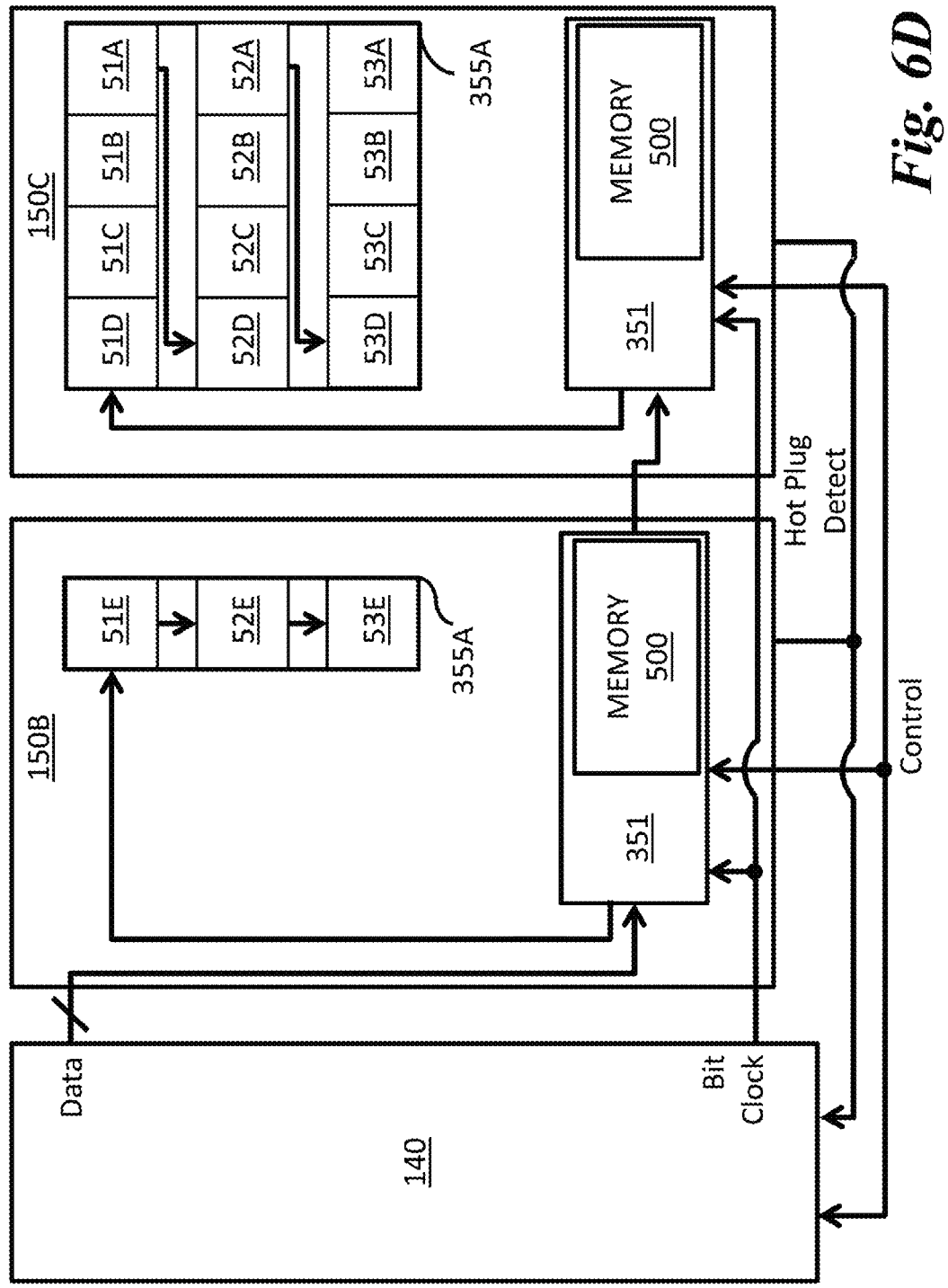
Figure 6E:
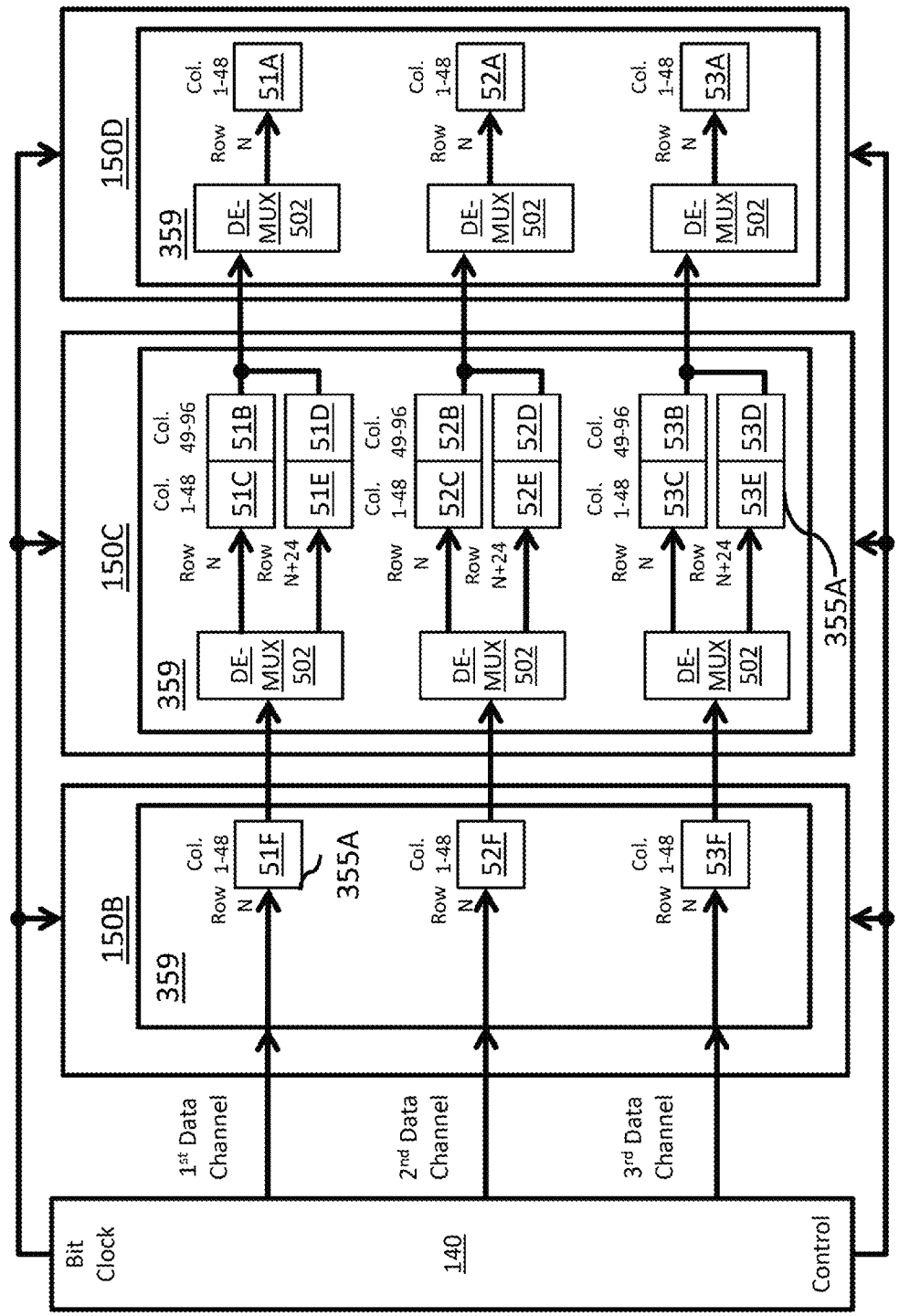

FIG. 6, which includes FIGS. 6A-6E, illustrates embodiment signaling configurations for transmitting data from the receiver unit to LED panels of different resolutions. FIG. 6A illustrates transmitting digital video data using a data-shifting daisy-chain configuration. FIG. 6B illustrates transmitting identifiably assigned digital video data using a pre-configured daisy-chain configuration. FIG. 6C illustrates transmitting identifiably assigned analog video data using a pre-configured daisy-chain configuration. FIG. 6D illustrates transmitting identifiably assigned digital video data in a dynamically adaptable daisy-chain configuration. FIG. 6E illustrates transmitting multiplexed digital video data using a data-shifting daisy-chain configuration.

FIG. 6A illustrates an embodiment transmitting serial digital video data to panels of different resolutions using a data-shifting daisy-chain configuration. The receiver unit 140 is pre-configured to know information about panels 150B-C, including the panels' resolutions, and pixel counts/local video frame sizes. A global video frame for collective display across embodiment panels 150B and 150C is divided into two local video frames. A first local video frame is divided into data sets 51E, 52E, and 53E that are stored in panel 150B. A variable number of data transmission channels M may be used. In this embodiment, when 3 data channels are used, panel 150B has 1,152 pixels organized into 24 horizontal lines of 48 pixels each, which could be implemented in, for example, a 1'×2' display panel with a pitch of 12.7 mm between pixels. A second local video frame is divided into data sets 51A-51D, 52A-52D, and 53A-53D that are stored in panel 150C. In this embodiment, when 3 data channels are used, panel 150C has 4608 pixels organized into 48 horizontal lines of 96 pixels each, which could be implemented in a 1'×2' display panel with a pitch of 6.35 mm between pixels. Different panel sizes and resolutions may be used in other embodiments.

In embodiments of the present invention, any of the formats of FIGS. 5A-5G may be used for the data sets 51A-E, 52A-E, and 53A-E that are respectively divided for transmission into M data channels and optionally into multiple scan groups and are then buffered into video memory in panels 150B and 150C. In other embodiments, other digital data storage formats may be used. In FIG. 6A, the video memories of panels 150B and 150C are implemented as shift registers 355A. When three data channels are used to transmit, for example, 4:4:4 RGB component video, blue pixel components could be transmitted in the first data channel, green components could be transmitted in the second data channel, and red components could be transmitted in the third data channel, so that buffered data sets 51A-51D collectively could represent the blue component of a 4,608 pixel local video frame, buffered data set 51E could represent the blue component of an 1152 pixel local video frame, and buffered data sets 52A-52E and 53A-53E could respectively represent the green and red components of these two frames. When more than three data channels are present, the data could be divided into smaller bit amounts in each channel than the 4 or 8-bit groups depicted in the data sets of FIGS. 5A-5G. In other embodiments, any number of data channels could divide up the number of pixels in a video frame in accordance with the data set formatting depicted in FIG. 5F-5G.

In FIG. 6A, data set 51A is sent serially across the first data channel between the receiver unit 140 and panel 150B in accordance with a bit clock, until a first location in one of the shift registers 355A of panel 150B is full. Then data set 51B is sent serially across the first data channel between receiver unit 140 and panel 150B, and each bit of data set 51A is shifted into the shift registers 355A of panel 150C as each bit of data set 51B is received by panel 150B. Transmission of data sets 51C-51E continues until data sets 51A-51D are completely shifted into the shift registers 355A of panel 150C and data set 51E is stored in the shift registers 355A of 150B. In the same way, data sets 52A-52E and 53A-53E are sent serially by receiver unit 140 to panel 150B, with data sets 52A-52D and 53A-53D then shifted into the shift registers 355A of panel 150C so that only the local video frame for panel 150B comprising data sets 51E, 52E, and 53E continues to be stored in the shift registers in panel 150B. At this time, the local video frame for panel 150C comprising data sets 51A-51D, 52A-52D, and 53A-53D is stored in panel 150C.

A frame clock, latch signal, or other control signal provided by the receiver unit 140 may signal panels 150B and 150C to display the local video frames stored in their buffer memories. In an embodiment, HSYNC data is transmitted serially with pixel data. In other embodiments, new rows in the data are indicated by an HSYNC signal, latch signal, or other control signal provided by the receiver unit 140. In an embodiment, multi-pin connections can be used to support signaling in the channels between the receiver unit 140 and the panels 150B and 150C. An exemplary 16-pin connection includes a latch pin, a clock pin, five address pins, an enable pin, three data pins, a signaling voltage pin, a signaling ground pin, a power supply pin, a power return pin, and a power ground pin. More or fewer pins may be provided for any of the foregoing pin types, and not all pin types may be provided in a multi-pin connection.

FIG. 6B illustrates transmitting identifiably assigned digital video data using a pre-configured daisy-chain configuration. The difference between this embodiment and the embodiment of FIG. 6A is that video data is sent in segments/packets over one or more data channels using a multiple access technique such as packet addressing or time division multiplexing such that the destination panel assigned to each segment is identifiable. In an embodiment, before receiver unit 140 begins sending data, it initializes panels 150B and 150C using a control channel by providing the interface circuits 351 of both panels with a unique address, time slot number (TSN), or other identifying information, which each interface circuit stores in a memory 500. A video frame destined for one of the panels is divided into one or more video segments. In an embodiment, a destination address is inserted by receiver unit 140 into the data stream as a header to the video segment. In other embodiments, a video segment intended for one of panels 150B and 150C is inserted by receiver unit 140 into a time slot in the data stream in accordance with a TSN assigned to the destination panel. In other embodiments, the receiver unit 140 indicates using a control/address signal on the control channel to indicate which of panels 150B or 150C should be actively receiving data. Interface circuit 351 in panel 150B determines, in accordance with the control/address signal or the address or TSN stored in its memory 500, whether data being received is intended for panel 150B, or whether it should be forwarded to the interface circuit of panel 150C.

In an embodiment, different panels 150B and 150C may have a different refresh rate. For example, panel 150B may have a slower refresh rate than panel 150C. The identifying information provided to panel 150B can notify it that inbound data from the receiver unit 140 is not intended to refresh panel 150B when panel 150B is not in its refresh period, in which case the inbound data will bypass the shift registers 355A of panel 150B. This bypassed data will then be delivered to panel 150C so that panel 150C may refresh its data in accordance with the higher refresh rate. For example, this may be used when panel 150B is intended to display text while panel 150C is intended to display high frame rate video such as sports or other action. By using multiple refresh rates, lower data rates may be used rather than having to send data to all panels at the refresh rate of the highest frame rate panel.

FIG. 6C illustrates transmitting assigned analog video data using a pre-configured daisy-chain configuration. The difference between this embodiment and the embodiment of FIG. 6B is that video data is sent in an analog form such as RGB component video, $YC_BC_R$ component video, composite video, S-video, etc., in assigned time slots such that the destination display panel can be determined by interface circuits 351 in accordance with the assigned TSN for each panel. Analog data arriving at one of the graphics processors 357 is converted to digital data that is stored in buffer video memory 355 in accordance with, for example, one of the digital storage formats of FIGS. 5A-5G.

FIG. 6D illustrates transmitting digital video data using a dynamically adaptable daisy-chain configuration. The difference between this embodiment and the embodiment of FIG. 6B is that panels 150B and 150C can be dynamically added to the configuration using a hot plug detect channel and a bi-directional control channel. When a panel 150C is added to the configuration, it sends a signal on the hot plug detect channel to notify receiver unit 140 of its existence. An initialization sequence is then performed over the control channel. Panel 150C sends the receiver unit 140 its resolution information. In embodiments of the invention, panel 150C or panel 150B determines a unique address for panel 150C in accordance with the address of existing panel 150B, and then sends this address to receiver unit 140 over the control channel. In other embodiments, receiver unit 140 assigns a unique address to panel 150C over the control channel, which the interface circuit 351 stores in memory 500. Interface circuit 351 in panel 150B determines in accordance with the stored address whether data being received is intended for panel 150B, or whether it should be forwarded to the interface circuit of panel 150C.

FIG. 6E illustrates transmitting row-multiplexed digital video data using a data-shifting daisy-chain configuration. The differences between this embodiment and the embodiment of FIG. 6A are that three data channels are used, another panel 150D is included in a daisy chain after panel 150C, data is divided by rows among different shift registers 355A, and a scanning pattern is used to reduce memory requirements of the panels. In this embodiment, the receiver unit 140 is pre-configured to know information about panels 150B-D, including the panels' resolutions, pixel counts/ local video frame sizes, number of scan groups, refresh rates, and number of rows and columns of shift registers 355A of each scan group. A global video frame for collective display across embodiment panels 150B-150D is divided into three local video frames, which are each in turn divided into 24 scan groups. A first scan group of a first local video frame is divided into data sets 51F, 52F, and 53F that is stored in panel 150B, which has 1,152 pixels organized into 24 horizontal lines of 48 pixels each and which could be implemented in, for example, a 1'×2' display panel with a pitch of 12.7 mm between pixels. A first scan group of a second local video frame is divided into data sets 51B-51E, 52B-52E, and 53B-53E that are stored in panel 150C, which has 4608 pixels organized into 48 horizontal lines of 96 pixels each. Panel 150C could be implemented in, for example, a 1'×2' display panel with a pitch of 6.35 mm between pixels. A first scan group of a third local video frame is divided into data sets 51A, 52A, and 53A that is stored in panel 150D, which has the same resolution and number of pixels as panel 150B. Different panel sizes and resolutions may be used in other embodiments.

In the embodiment of FIG. 6E, data set 51A is sent serially across the first data channel between the receiver unit 140 and panel 150B in accordance with a bit clock, until a first location in one of the shift registers 355A of panel 150B is full. Then data set 51B is sent serially across the first data channel between the receiver unit 140 and panel 150B, forcing data set 51A to pass through the demultiplexer 502 of panel 150C and into an active shift register in panel 150C. In accordance with either a control signal (such as an address signal) or with the position in the data stream of the data set, the active shift register is either the combined first (topmost) shift register of panel 150C—which is formed from two daisy-chained 48-position shift registers and corresponds to the Nth row of pixels in the panel's pixel array, or the combined second shift register—which corresponds to pixels on row N+24, with N being the active scanning period. Each combined shift register in panel 150C contains 96 positions that correspond to the 96 columns in the pixel array. Each scan group contains two rows, such as the first 96-position shift register and the second 96-position shift register. When the active shift register of panel 150C is full and additional data arrives at the active shift register, data set 51A is then shifted into the first shift register of panel 150D, passing through a demultiplexer included in the panel, for example, to support future changes in scanning pattern and shift register components. In this example, in accordance with the control signal the active shift register of panel 150C is the first shift register when data sets 51B-51C are shifted into panel 150C, and the active shift register is the second shift register when data sets 51D-51E are shifted into panel 150C.

Referring again to FIG. 6E, transmission of data sets 51C-51F continues until data set 51A is completely shifted into panel 150D, data sets 51B-51E are completely shifted into the shift registers 355A of panel 150C and data set 51F is stored in the first shift register of 150B. In the same way, data sets 52A and 53A are sent serially by receiver unit 140 to panel 150D, data sets 52B-52E and 53B-53E are sent to panel 150C, and data sets 52F and 53F are sent by the receiver unit 140 to panel 150B. In an embodiment, a scanning clock, latch signal, pre-configured, or other control signal provided by the receiver unit 140 may then signal panels 150B-150D to display the scanning frames stored in their video memories. In other embodiments, the scanning frames are displayed in accordance with a timer.

Referring again to FIG. 6E, during scanning period N, panel 150C illuminates the first and 25$^{th}$ row of pixels in its pixel array and panels 150B and 150D illuminate their first row of pixels in accordance with the data stored in video memory. During 23 subsequent scanning periods, additional data is shifted into panels 150B-150D, which then in accordance with the scanning period sequentially illuminate 23 other linked scan groups made up of pixel rows of the LED display. In other embodiments, any number of scanning periods may be used. The scanning period is indicated by, for example, a scan select signal, a scanning timer, or an address select signal sent by receiver unit 140.

Figure 7A:
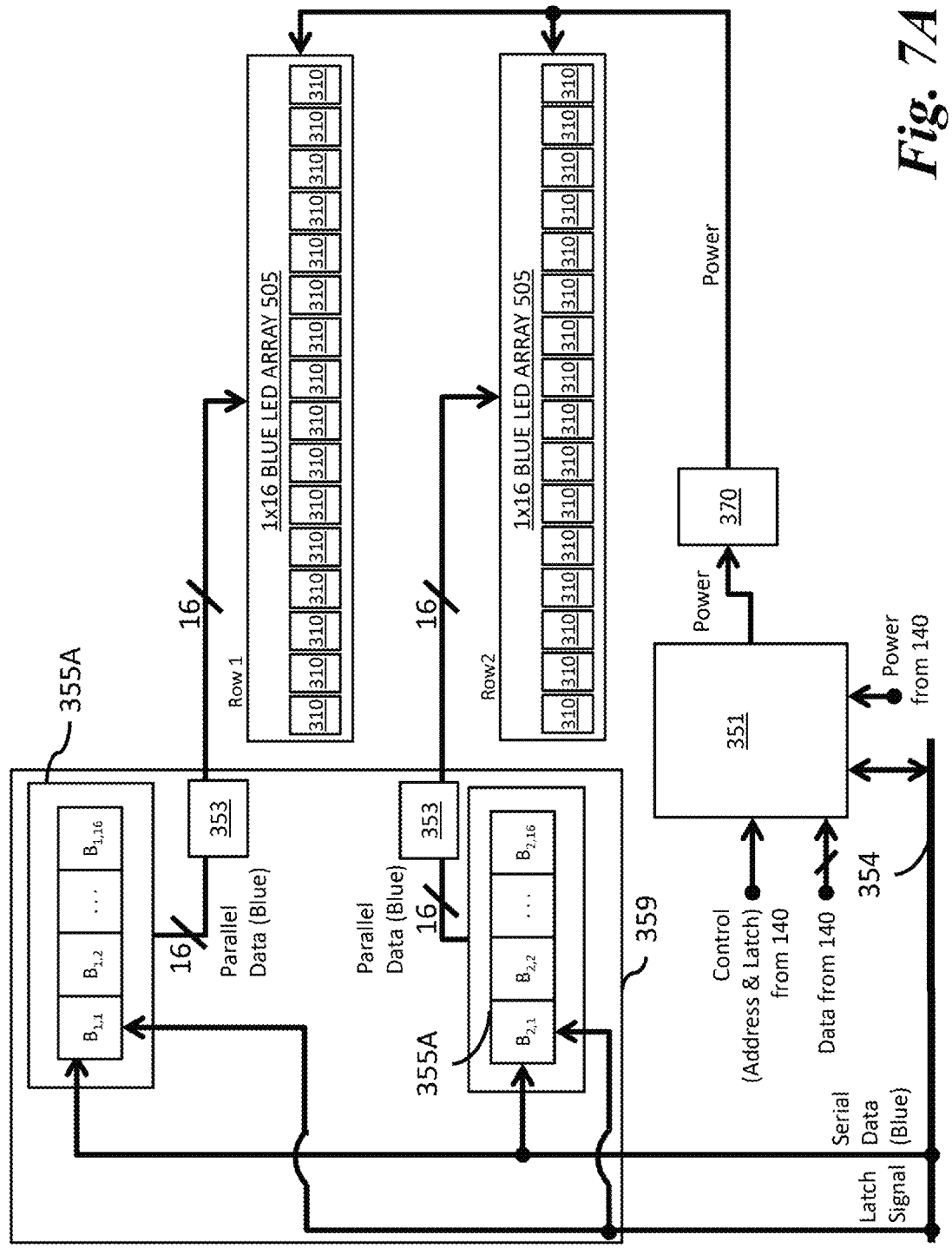
FIGS. 7A-7E, illustrates embodiment panel circuitry for implementing the signaling configurations of FIG. 6.
Figure 7B:
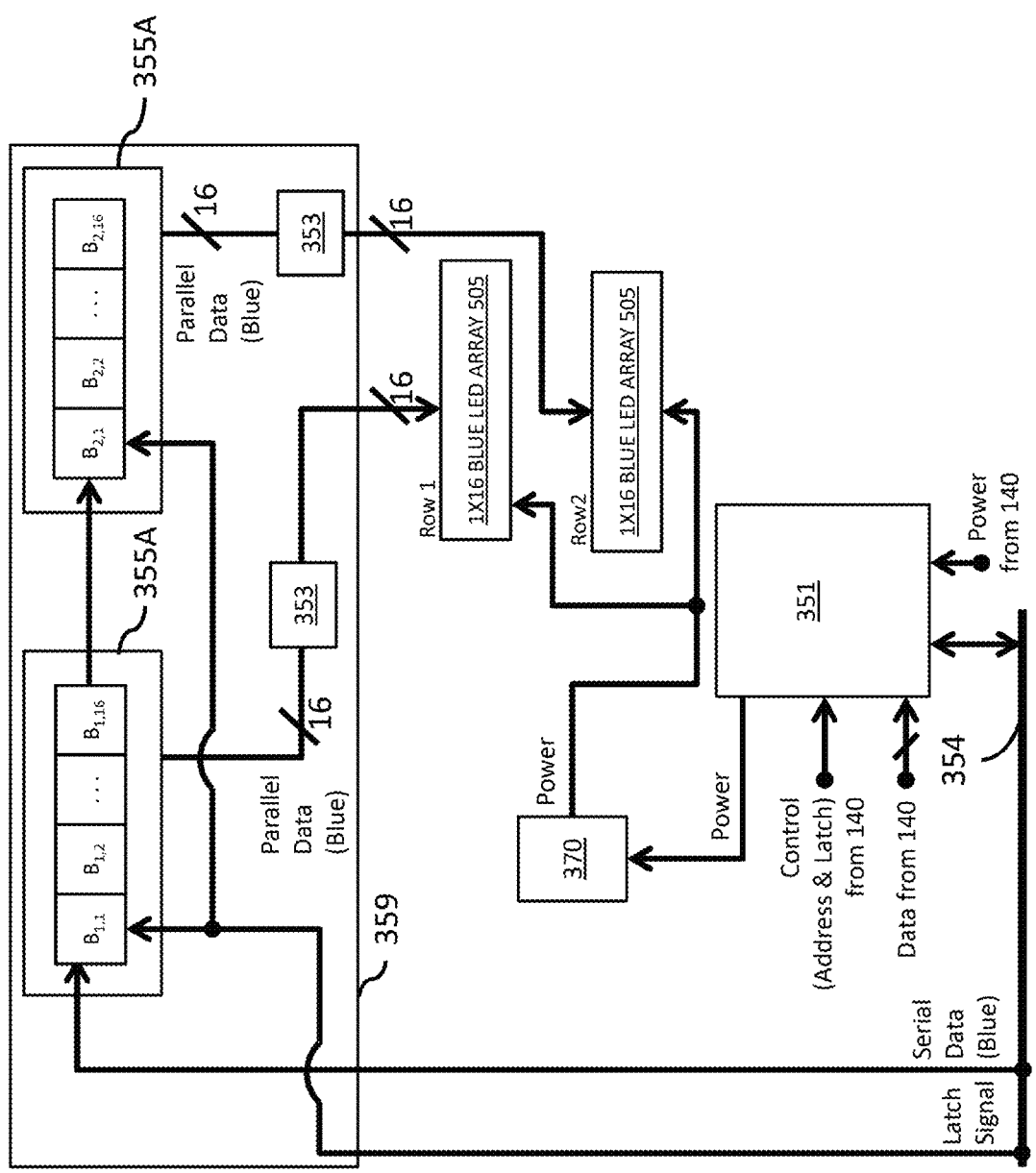
Figure 7C:
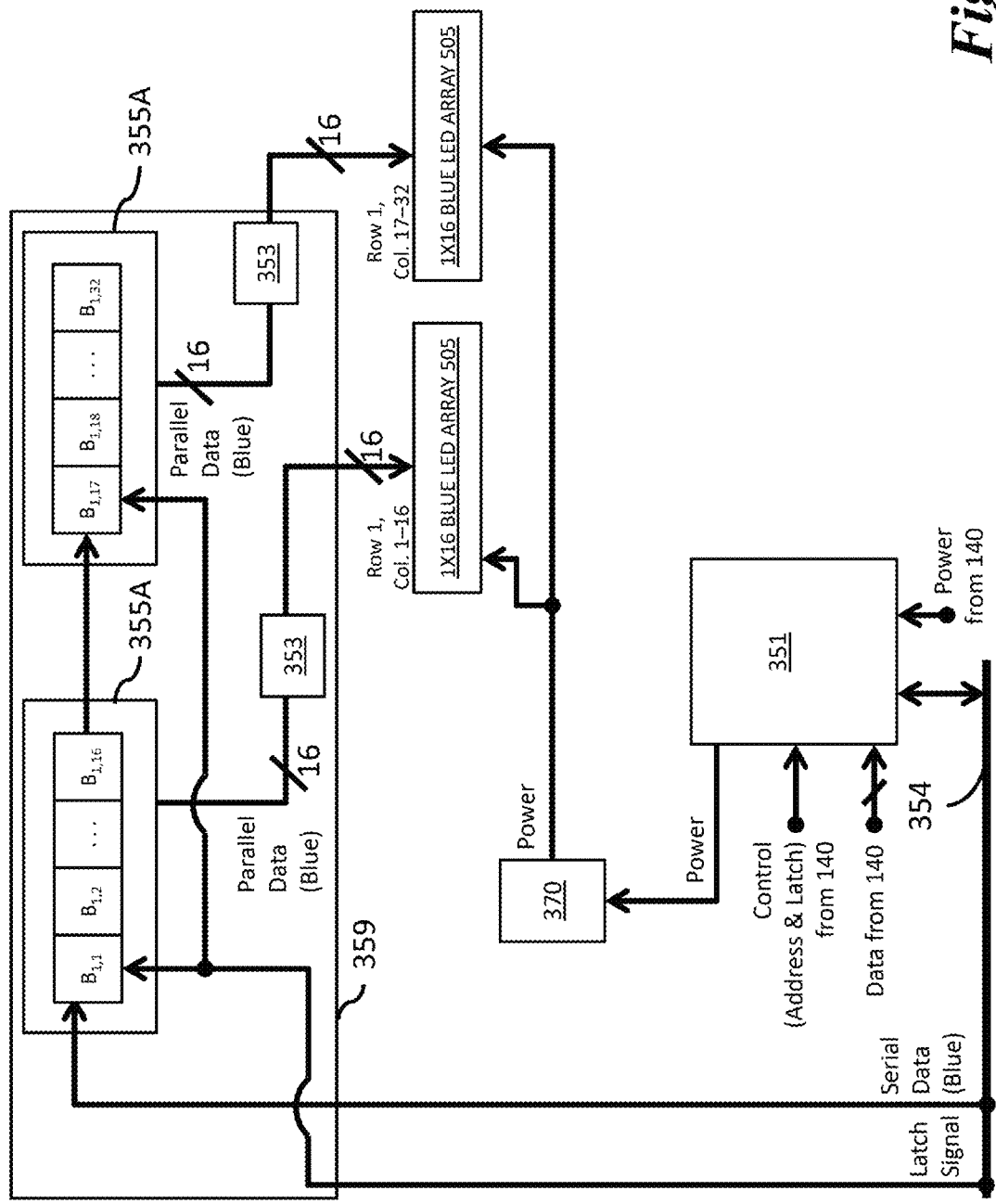
Figure 7D:
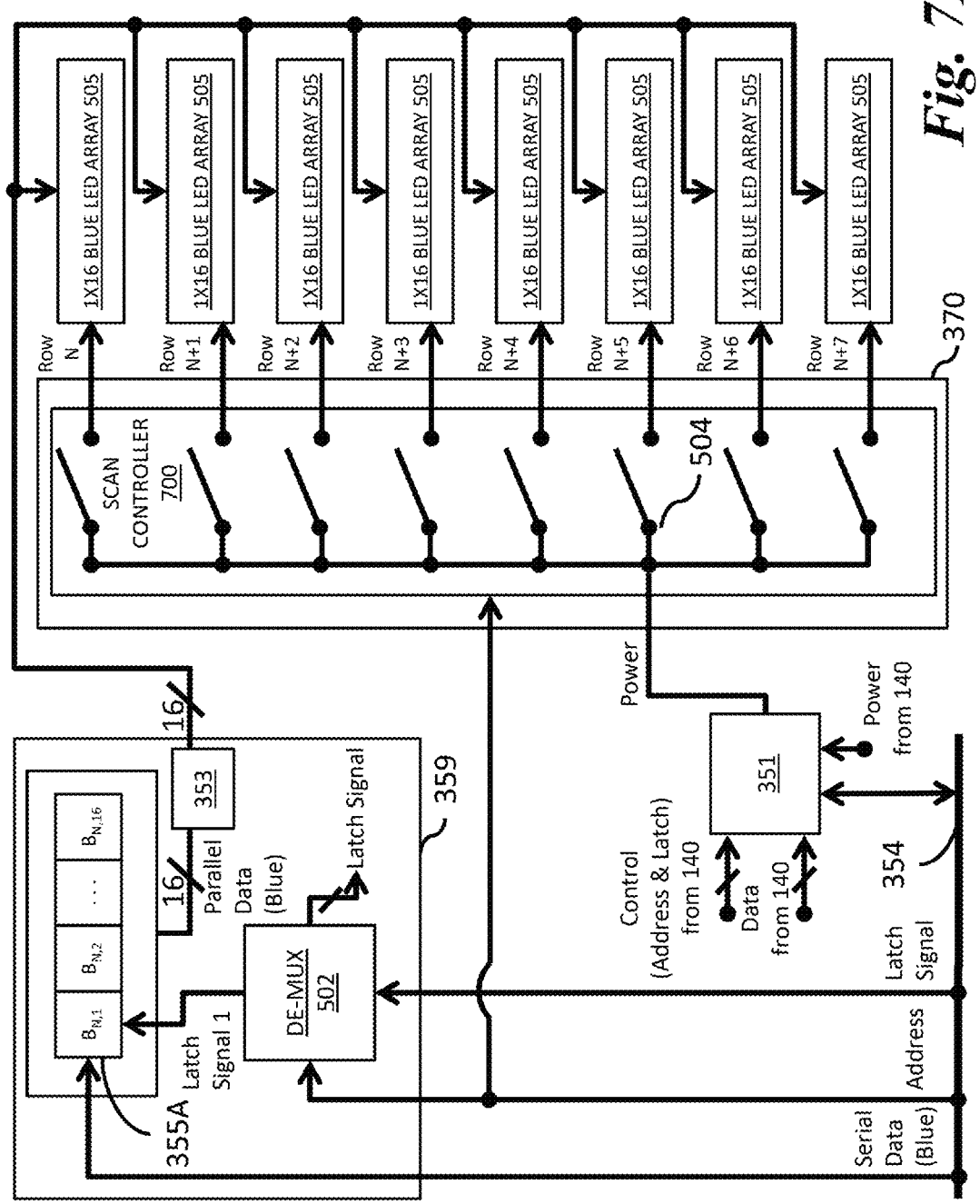
Figure 7E:
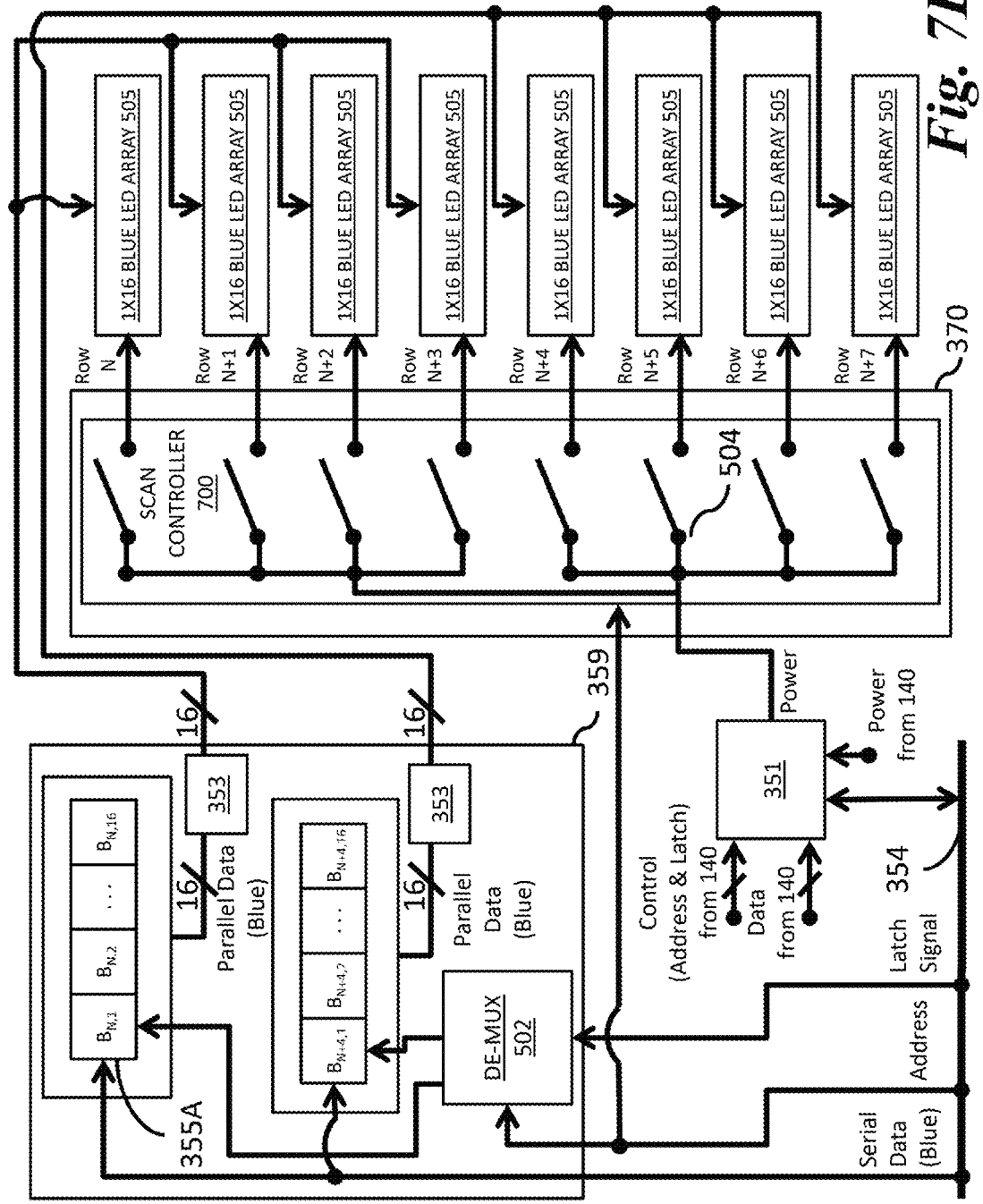

FIG. 7, which includes FIGS. 7A-7E, illustrates embodiment panel circuit diagrams implementing the signaling configurations of FIG. 6. FIG. 7A illustrates a panel with two shift registers coupled in parallel through two current drivers to two rows of pixels. FIG. 7B illustrates two shift registers coupled together to form a long shift register providing parallel data for two rows of pixels. FIG. 7C illustrates two shift registers coupled together to form a long shift register providing data for a single row of pixels. FIG. 7D illustrates a shift register coupled to a scan controller to provide data for multiple rows of pixels in accordance with a scanning pattern. FIG. 7E illustrates two shift registers coupled to a demultiplexer and to a scan controller to provide data for multiple rows of pixels in accordance with a scanning pattern.

Referring to FIG. 7A, only blue data driving blue LEDs is shown for illustrative purposes. In an embodiment, red and green data would drive red LEDs and green LEDs, which are not shown. In other embodiments, red, green, and blue data would drive different input pins of tri-colored LEDs. In FIG. 7A, data, power, and control signaling (including, for example address and latch signaling) is received at an interface circuit 351 of one of the panels. Power is then supplied to the power supply unit 370, which then powers two rows that are 1×16 LED arrays 505 of blue LEDs. Blue data is shifted serially from the interface circuit to the shift registers 355A of LED controller 359. This data is shifted through a data bus 354. In other embodiments, individual data wires take the place of the data bus 354. The blue data is shifted in accordance with a latch or clock signal provided to the shift registers 355A. As the shift registers 355A fill with stored digital data words in their 16 data word positions, they provide this data on 16 parallel outputs to current drivers 353. In accordance with a current driver synchronization signal (not shown), which may be derived from a clock or latch signal provided by the receiver unit 140 to interface circuit 351, the current drivers 353 then act as current sinks to control the current or duty cycle of the two rows of 16 LEDs each in LED arrays 505. Other embodiments may use current drivers as current sources, and may use shift registers of various sizes.

Referring to FIG. 7B, the difference between this embodiment and the embodiment of FIG. 7A is that two shift registers 355A are coupled together to from a single long shift register. In FIG. 7B, 32 words of digital data must be stored in this combined shift register before data is provided on 32 parallel outputs to current drivers 353, which then control the current or duty cycle of the two rows of 16 LEDs each in LED arrays 505.

Referring to FIG. 7C, the difference between this embodiment and the embodiment of FIG. 7B is that the two 16-LED arrays 505 are configured to form a single row of 32 LEDs. In FIG. 7C, 32 words of digital data must be stored in a single long shift register before data is provided on 32 parallel outputs to current drivers 353, which then control the current or duty cycle of the single row of 32 LEDs in LED arrays 505.

Referring to FIG. 7D, only a single shift register 355A is shown for illustrative purposes. In FIG. 7D, latch signaling from the interface circuit 351 passes to the shift register 355A through a demultiplexer 502 that may also be coupled to other shift registers that are not shown. The demultiplexer 502 acts as a register switch to provide the latch signal only to an active shift register, which prevents the remaining shift registers from shifting in incoming serial data. The demultiplexer is controlled by an address select signal to select the active shift register. A scan select signal or other control signal, a scan timer, or the ordering of latch signals may also be used to control the demultiplexer 502. In other embodiments, the demultiplexer 502 acts as a data switch to pass serial data to the shift registers in accordance with, for example, the number of words received by a data counter.

Referring again to FIG. 7D, when the shift register 355A is full of 16 words of stored digital data, it then provides this data on 16 parallel outputs to a current driver 353, which then controls the current or duty cycle of 8 scan groups comprising one or more rows of 16 LEDs each in LED arrays 505. The shift register 355A receives data intended for the Nth LED row (the first row of the Nth scan group) during the Nth scan period. The power supply unit 370 includes a scan controller 700 that couples power to an active scan group in accordance with the address select signal provided by the receiver unit 140 to synchronize the demultiplexer 502 and scan controller 700. A scan select signal or scan timer may also be used to synchronize the scan controller 700. In other embodiments, the scan controller 700 is located outside the power supply unit 370 and may couple current from the current driver 353 to the LED arrays 505. In FIG. 7D, the scan controller 700 is an array of switches 504, which may be implemented, for example, as an array of transistors. The scan controller 700 may also be implemented using one or more demultiplexers.

Referring to FIG. 7E, the difference between this embodiment and the embodiment of FIG. 7D is that the rows of LEDs in LED arrays 505 are organized into only 4 scan groups of at least two rows each. The scan controller 700 switches power to pairs of rows in each of the 4 scan groups. When each of the two illustrated shift registers 355A is full of 16 words of stored digital data, it then provides this data on 16 parallel outputs to a current driver 353, which then controls the current or duty cycle of one row in each of the 4 scan groups. The demultiplexer 502 and the two shift registers 355A and two current drivers 353 are all components of the LED controller 359. In other embodiments, the demultiplexer 502 is located outside multiple LED controllers that each include only one shift register 355A and current driver 353 such that the demultiplexer 502 only activates one LED controller at a time.

Referring again to FIG. 7E, a first shift register provides data to control current to a first row in each of the 4 scan groups, and the second shift register provides data to control current to a second row in each of the 4 scan groups. In other embodiments, other numbers of shift registers may be used, and data for multiple rows in a scan group may be provided by a single scan group.

Figure 8:
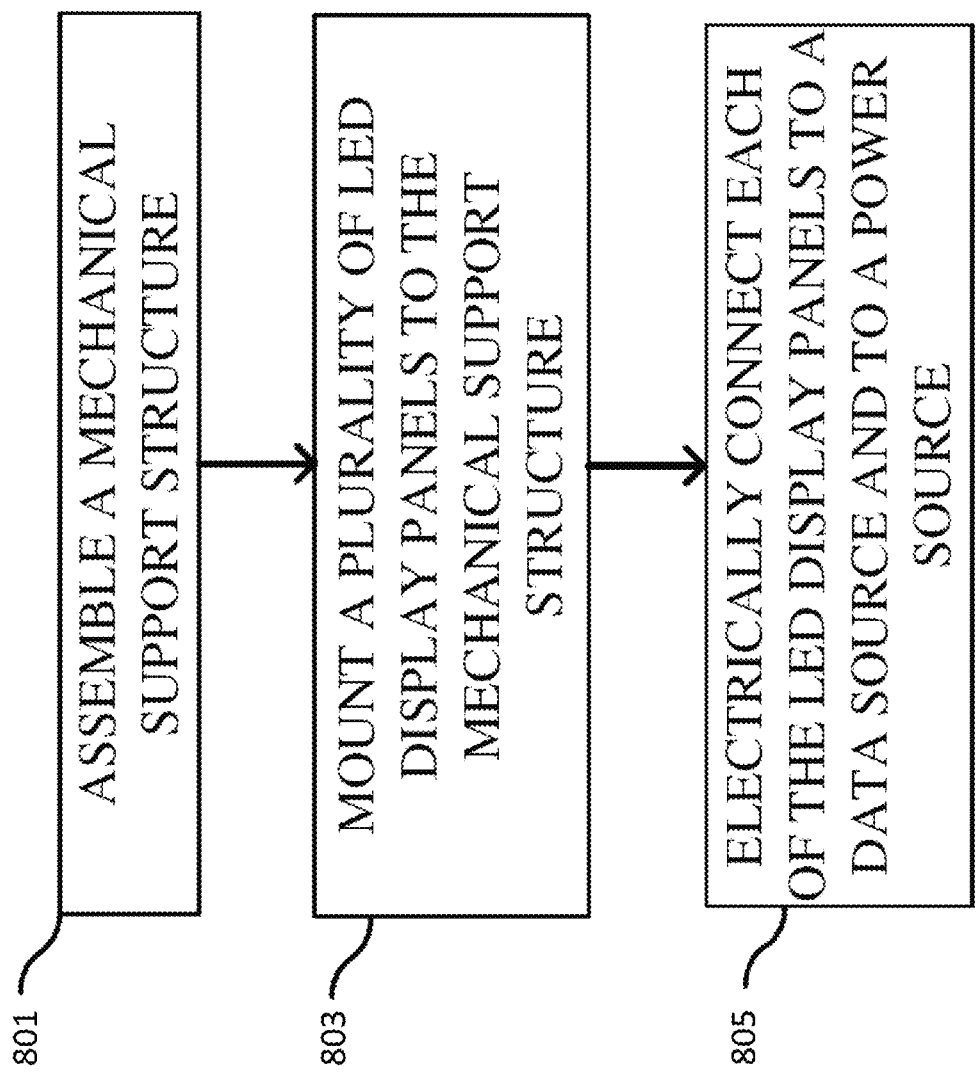
FIG. 8 illustrates a method of assembling the modular multi-panel display system in accordance with embodiments of the present invention.

FIG. 8 illustrates a method of assembling the modular multi-panel display system discussed in various embodiments. A mechanical support structure such as the frame 110 described in FIG. 1 above is assembled taking into account various parameters such as the size and weight of the multi-panel display, location and zoning requirements, and others (box 801). For example, as previously described, the mechanical support structure includes a plurality of vertical bars and horizontal bars. The mechanical support structure may be fabricated from a corrosion resistant material in one or more embodiments. For example, the mechanical support structure may be coated with a weather-proofing coating that prevents the underlying substrate from corroding.

A plurality of LED display panels are mounted on to the mechanical support structure so as to form an integrated display panel that includes an array of rows and columns of LED display panels as described in various embodiments (box 803). Each of the LED display panels is hermetically sealed. Mounting the LED display panels may comprise mounting each LED display panel to a vertical or horizontal beam using an attachment plate.

Each of the LED display panels is electrically connected to a data source and to a power source (box 805). For example, a first LED display panel in each row is electrically coupled to a receiver unit. The other LED display panels in each row may be daisy-chain coupled to an adjacent LED display panel. In embodiments that are dynamically adaptable, no further configuration of the data source is necessary. In pre-configured embodiments, the data source is configured with information related to, for example, the number of LED display panels and the resolution and pitch of each LED display panel in each daisy-chained row.

Since the assembled display structure is light weight, significant assembly advantages can be achieved. For example, the panels can be assembled within a warehouse that is remote from the final location where the display will be utilized. In other words, the panels can be assembled at a first location, shipped to second location and finalized at the second location.

Figure 9:
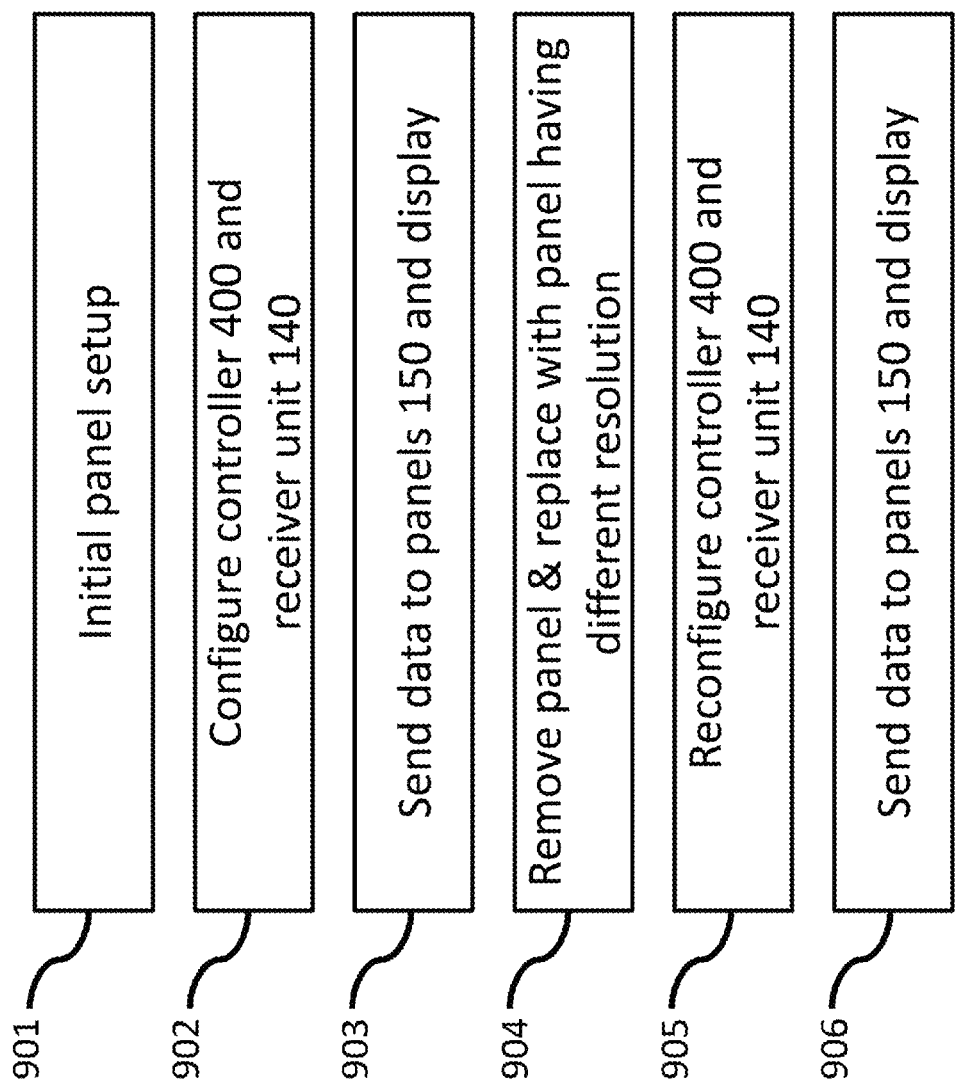
FIG. 9 illustrates a method of configuring and displaying data on the modular multi-panel display system in accordance with embodiments of the present invention.

In FIG. 9, a method of configuring and displaying data on the modular multi-panel display system in accordance with pre-configured embodiments of the present invention is illustrated. The panel is initially set up with mechanical and electrical connections in accordance with the method of FIG. 8 (box 901). The controller 400 and receiver unit 140 are then configured with information about individual LED display panels 150, including, for example, the panels' resolutions, pixel counts/local video frame sizes, number of scan groups, and number of rows and columns of each scan group. (box 902). In other embodiments, the modular display system is dynamically adaptable so that the LED display panels 150 send panel information to the receiver unit 140, which forwards some of all of this panel information to the controller 400. In accordance with the panel information, the controller 400 sends data to the receiver unit 140, which then sends data for display at the LED display panels 150 (box 903). As an example, an LED display panel 150 may be removed and replaced with a panel having a different resolution (box 904). The controller 400 and receiver unit 140 are then re-configured by an operator with updated panel information that includes the new resolution information (box 905). In dynamically adaptable embodiments, the LED display panels 150 send panel information to the receiver unit 140 and then to the controller 400. In accordance with this updated panel information, the controller 400 again sends data to the receiver unit 140, which then sends data again for display at the LED display panels 150 (box 906).

Although embodiments of the present invention have been described as being LED display panels, various embodiments of the present invention may also be applied to any type of display panel including organic display including passive-matrix or active-matrix displays, organic transistor based displays, micro-mirror displays, plasma display, liquid crystal display, surface-conduction electron-emitter display, field emission display, and others.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of displaying media, the method comprising:
providing a digital display system comprising a plurality of modular digital display panels so as to form an integrated display surface, each modular display panel having a first size and shape with a dimension of one foot by two feet, and wherein each modular display panel includes an LED pixel array arranged at a pitch selected from the group consisting of 6.35 mm, 7.62 mm, 9.525 mm, 12.7 mm, 15.24 mm, 19.05 mm, 25.4 mm, and 30.48 mm; and
displaying media on the digital display system.

2. The method of claim 1, wherein each modular display panel further comprises a switch array coupled to a power source and to the LED pixel array, wherein the switch array switches power to at least one active pixel from the LED pixel array in accordance with at least one of a scan select signal, a scan timer, and an address select signal.

3. The method of claim 1, wherein each modular display panel further comprises a plurality of shift registers and a register switch coupled to the plurality of shift registers; and
wherein the register switch selects a first active shift register from the plurality of shift registers in accordance with at least one of a scan select signal, a scan timer, an address select signal, a latch signal, and a data counter.

4. The method of claim 1, wherein the digital display system further comprises a receiver unit coupled to the plurality of modular display panels;
wherein each modular display panel further comprises a video memory; and
wherein the receiver unit provides an identifiable video segment to each modular display panel.

5. The method of claim 1, wherein the display surface comprises a first region and a second region, the first region comprising ones of the modular display panels and the second region having other ones of the modular display panels;
wherein each of the ones of the modular display panels have a first pitch and each of the other ones of the modular display panels have a second pitch that is different than the first pitch; and
displaying the media comprises simultaneously displaying a first media in the first region and a second media in the second region.

6. The method of claim 5, wherein the media is displayed at a higher resolution than the second media, and wherein the first media is displayed at a higher frame rate than the second media.

7. The method of claim 5, wherein the first media comprises video and the second media comprises text.

8. The method of claim 5, wherein the ones of the modular display panels are located at a central region of the display surface, and wherein the other ones of the modular display panels are located at an outer edge of the display surface.

9. The method of claim 5, wherein the plurality of modular display panels further comprises a third modular display panel that is one foot by two feet in dimension, the third modular display panel comprising a third LED pixel array arranged at a third pitch that is different than the first pitch and the second pitch.

10. The method of claim 5, wherein the digital display system further comprises a receiver unit coupled to the plurality of modular display panels;
wherein each modular display panel of the first region further comprises a first video memory;
wherein each modular display panel of the second region further comprises a second video memory;
wherein the receiver unit provides a first identifiable video segment to each modular display panel of the first region and a second identifiable video segment to each modular display panel of the second region;
wherein each modular display panel of the first region digitally stores the first identifiable video segment in the first video memory in accordance with a first unique identifier, the first unique identifier comprising a time-slot number or an address; and
wherein each modular display panel of the second region digitally stores the second identifiable video segment in the second video memory in accordance with a second unique identifier, the second unique identifier comprising a time-slot number or an address.

11. The method of claim 5, wherein the digital display system further comprises a receiver unit coupled to the plurality of modular display panels;
wherein one of the modular display panels of the first region further comprises a first video memory of a first size; and
wherein one of the modular display panels of the second region is coupled to the of the modular display panels of the first region and further comprises a second video memory of a second size that is different from the first size.

12. The method of claim 11, wherein the receiver unit is configured to provide to the one of the modular display panels of the first region a first video segment sized in accordance with the first size preceded by a second video segment sized in accordance with the second size.

13. The method of claim 12,
wherein the one of the modular display panels of the first region is configured shifts the second video segment to the one of the modular display panels of the second region such that the one of the modular display panels of the second region digitally stores the second video segment to completely fill the second video memory, and
wherein the one of the modular display panels of the first region is configured digitally stores the first video segment to completely fill the first video memory.

14. A modular digital display system comprising:
a mechanical support structure comprising a plurality of vertical beams and a plurality of horizontal beams;
a plurality of digital display panels mounted to the mechanical support structure so as to form an integrated display panel comprising a display surface, wherein the mechanical support structure is configured to provide mechanical support to the plurality of digital display panels, wherein each of the digital display panel is water and weather proof and requires no additional weather protection cabinetry;
wherein each of the display panels has the same size and shape, each display panel having a substantially rectangular perimeter having a dimension of one foot by two feet; and
wherein each of the display panels comprises a plurality of LEDs arranged in a pixel array having a pitch selected from the group consisting of 6.35 mm, 7.62 mm, 9.525 mm, 12.7 mm, 15.24 mm, 19.05 mm, 25.4 mm, and 30.48 mm.

15. The system of claim 14, wherein each display panel further comprises a power supply and a switch array coupled to the power supply and to the pixel array; and wherein, for each display panel, the switch array is configured to switch power to an input of a light emitting pixel unit in the pixel array in accordance with at least one of a scan select signal, a scan timer, and an address select signal.

16. The system of claim 14, wherein each display panel further comprises a data switch and a plurality of controllers;

wherein, for each display panel, the data switch is configured to select a first active controller from the plurality of controllers in accordance with at least one of a scan select signal, a scan timer, an address select signal, a latch signal, and a data counter; and wherein the first active controller comprises a first shift register coupled to a first current driver.

17. The system of claim 14, wherein the display surface comprises a first region and a second region;

wherein the first region comprises a first display panel and the second region comprises a second display panel attached to the first display panel; and wherein the pixel array of the first display panel has a first pitch and the pixel array of the second panel has a second pitch that is different than the first pitch.

18. The system of claim 17, wherein the plurality of digital display panels further comprises a third display panel, and wherein the third display panel comprises a third pixel array having a third pitch that is different from the first pitch.

19. The system of claim 17, wherein the second display panel is located along a bottom edge of the display surface.

20. The system of claim 17, wherein the first display panel is one of a plurality of display panels having the first pitch that are arranged in a central region of the display surface, and wherein the second display panel is one of a plurality of display panels having the second pitch located at an outer edge of the display surface.

21. The system of claim 17, further comprising a receiver unit coupled to the plurality of display panels;

wherein the first display panel further comprises a first video memory;

wherein the second display panel further comprises a second video memory;

wherein the receiver unit is configured to provide a first identifiable video segment to the first display panel and a second identifiable video segment to the second display panel;

wherein the first display panel is configured to digitally store the first identifiable video segment in the first video memory in accordance with a first unique identifier, the first unique identifier comprising a time-slot number or an address; and wherein the second display panel is configured to digitally store the second identifiable video segment in the second video memory in accordance with a second unique identifier, the second unique identifier comprising a time-slot number or an address.

22. The system of claim 17, further comprising a receiver unit coupled to the plurality of display panels;

wherein the first display panel further comprises a first video memory of a first size;

wherein the second display panel further comprises a second video memory of a second size that is different than the first size;

wherein the receiver unit is configured to provide the first display panel a first video segment sized in accordance with the first size preceded by a second video segment sized in accordance with the second size;

wherein the first display panel is configured to shift the second video segment to the second display panel;

wherein the second display panel is configured to digitally store the second video segment to completely fill the second video memory; and wherein the first display panel is configured to digitally store the first video segment to completely fill the first video memory.

23. A modular display panel comprising:

a casing having a recess and attachment points for use in attachment as part of a multi-panel modular display, a perimeter of the casing being substantially rectangular and having dimensions of one foot by two feet;

a printed circuit board disposed in the recess;

an array of LEDs attached to a front side of the printed circuit board, the LEDs arranged relative to one another at a pitch selected from the group consisting of 6.35 mm, 7.62 mm, 9.525 mm, 12.7 mm, 15.24 mm, 19.05 mm, 25.4 mm, and 30.48 mm; and a driver circuit electrically coupled to the printed circuit board.

24. The display panel of claim 23, wherein the display panel is completely waterproof against submersion in up to 3 feet of water.

25. The display panel of claim 23, wherein the casing comprises a plastic casing.

26. The display panel of claim 23, wherein the casing comprises an aluminum casing.

27. The display panel of claim 23, wherein the LEDs each comprises a surface mount device and wherein the a pitch selected from the group consisting of 6.35 mm, 7.62 mm, 9.525 mm, and 12.7 mm.

28. The display panel of claim 23, further comprising a cable connector configured to provide power and data to the modular display panel, the cable connector comprising:

a plurality of data connectors surrounded by an end enclosure, each data connector electrically coupled to a corresponding data wire; and a plurality of power connectors surrounded by the end enclosure, each power connector electrically coupled to a corresponding power wire.

29. The display panel of claim 23, further comprising a power supply unit mounted outside the casing.

30. The display panel of claim 23, further comprising a power supply unit disposed within the casing.

31. A method of manufacturing a plurality of display panels, the method comprising:

providing a plurality of 1'×2' casings, each casing having a recess and attachment points for use in attachment as part of a multi-panel modular display, a perimeter of each casing being substantially rectangular and having dimensions of one foot by two feet;

forming a first display panel by attaching a first printed circuit board in the recess of a first one of the 1'×2' casings, the first printed circuit boarding having a first array of LEDs attached to a front side thereof, the LEDs of the first array arranged relative to one another at a first pitch; and forming a second display panel by attaching a second printed circuit board in the recess of a second one of the 1'×2' casings, the second printed circuit boarding having a second array of LEDs attached to a front side thereof, the LEDs of the second array arranged relative to one another at a second pitch that is different than the first pitch.

32. The method of claim 31, wherein the first pitch is selected from the group consisting of 6.35 mm, 7.62 mm, 9.525 mm, 12.7 mm, 15.24 mm, 19.05 mm, 25.4 mm, and 30.48 mm; and wherein the second pitch is selected from the group consisting of 6.35 mm, 7.62 mm, 9.525 mm, 12.7 mm, 15.24 mm, 19.05 mm, 25.4 mm, and 30.48 mm.

33. The method of claim 31, further comprising:

sealing the first display panel to be completely waterproof against submersion in up to 3 feet of water; and sealing the second display panel to be completely waterproof against submersion in up to 3 feet of water.

\* \* \* \* \*